United States Patent
Hagihara

(10) Patent No.: US 9,967,491 B2
(45) Date of Patent: May 8, 2018

(54) IMAGING DEVICE AND IMAGING SYSTEM

(71) Applicant: OLYMPUS CORPORATION, Tokyo (JP)

(72) Inventor: Yoshio Hagihara, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days. days.

(21) Appl. No.: 15/435,614

(22) Filed: Feb. 17, 2017

(65) Prior Publication Data

US 2017/0163922 A1 Jun. 8, 2017

Related U.S. Application Data

(63) Continuation of application No. PCT/JP2014/072799, filed on Aug. 29, 2014.

(51) Int. Cl.
*H04N 5/3745* (2011.01)
*H01L 27/146* (2006.01)
*H04N 5/357* (2011.01)

(52) U.S. Cl.
CPC ..... *H04N 5/3745* (2013.01); *H01L 27/14614* (2013.01); *H01L 27/14636* (2013.01); *H01L 27/14643* (2013.01); *H04N 5/3577* (2013.01)

(58) Field of Classification Search
CPC ............ H04N 5/3745; H01L 27/14636; H01L 27/14643; H01L 27/14614
See application file for complete search history.

(56) References Cited

U.S. PATENT DOCUMENTS

| | | | | |
|---|---|---|---|---|
| 8,508,628 | B2* | 8/2013 | Yamaguchi | H01L 27/14632 257/291 |
| 9,071,783 | B2* | 6/2015 | Ueno | H04N 5/37455 |
| 9,800,810 | B2* | 10/2017 | Kikuchi | H04N 5/359 |
| 2012/0044398 | A1* | 2/2012 | Chou | H04N 5/3577 348/308 |

(Continued)

FOREIGN PATENT DOCUMENTS

| JP | 2011-55196 A | 3/2011 |
|---|---|---|
| JP | 2012-39386 A | 2/2012 |

(Continued)

OTHER PUBLICATIONS

Uchida et al., "ITE Technical Report", vol. 37, No. 29, 2013 (partial translation).

(Continued)

*Primary Examiner* — Hung Lam
(74) *Attorney, Agent, or Firm* — Westerman, Hattori, Daniels & Adrian, LLP

(57) ABSTRACT

A first voltage line supplies a constant first voltage in column circuits of an imaging device. A second voltage line supplies a second voltage that is lower than the first voltage and is constant. A third voltage line supplies a constant third voltage. A fourth voltage line supplies a fourth voltage that is lower than the third voltage and is constant. The first voltage line is electrically connected to a drain of an NMOS transistor, and the third voltage line is electrically connected to a gate of the NMOS transistor. The second voltage line is electrically connected to a drain of a PMOS transistor, and the fourth voltage line is electrically connected to a gate of the PMOS transistor.

9 Claims, 18 Drawing Sheets

(56) References Cited

U.S. PATENT DOCUMENTS

| | | |
|---|---|---|
| 2013/0207825 A1 | 8/2013 | Yamazaki |
| 2014/0098271 A1 | 4/2014 | Hagihara |
| 2015/0077412 A1* | 3/2015 | Nakamura ........... G09G 3/3233 |
| | | 345/212 |

FOREIGN PATENT DOCUMENTS

| | | |
|---|---|---|
| JP | 2013-165341 A | 8/2013 |
| JP | 2013-211651 | 10/2013 |
| JP | 2014-75691 A | 4/2014 |

OTHER PUBLICATIONS

International Search Report dated Oct. 28, 2014, issued in counterpart of International Application No. PCT/JP2014/072799 (1 page).

* cited by examiner

IMAGING DEVICE AND IMAGING SYSTEM

The present application is a continuation application based on International Patent Application No. PCT/JP2014/072799 filed Aug. 29, 2014, the content of which is incorporated herein by reference.

BACKGROUND OF THE INVENTION

Field of the Invention

The present invention relates to an imaging device and an imaging system.

Description of Related Art

As an example of an imaging device that uses a Time-to-Digital Converter Single-Slope (TDC SS)-type A/D conversion circuit obtained by combining a Time-to-Digital Converter (TDC)-type A/D conversion circuit and a Single-Slope (SS)-type A/D conversion circuit, a configuration disclosed in Japanese Patent Application Publication No. 2011-55196 is known. FIG. 15 illustrates a part of a configuration of a TDC SS-type A/D conversion circuit as a first conventional example. The configuration and an operation of the circuit illustrated in FIG. 15 will be described below.

The circuit illustrated in FIG. 15 has a comparison unit 1031, a latch unit 1033, a counter unit 1034, and a buffer circuit BUF. The comparison unit 1031 has a voltage comparator COMP. An analog signal "Signal" to be A/D-converted and a reference signal Ramp that decreases as time elapses are input to the voltage comparator COMP. The voltage comparator COMP outputs a comparison signal CO based on the result obtained by comparing the analog signal "Signal" to the reference signal Ramp. The latch unit 1033 has a plurality of latch circuits L_0 to L_7. The plurality of latch circuits L_0 to L_7 latch logic states of a plurality of phase signals CK[0] to CK[7] having different phases. The counter unit 1034 has a counter circuit CNT. The counter circuit CNT performs counting on the basis of the phase signal CK[7] output from the latch circuit L_7. A control signal RST is a signal for performing a reset operation of the counter circuit CNT.

The comparison unit 1031 generates a time interval (a size in a time axis direction) according to the amplitude of the analog signal "Signal". The buffer circuit BUF is an inverting buffer circuit which inverts and then outputs the input signal.

The latch circuits L_0 to L_7 constituting the latch unit 1033 are in an enabled (available, toggled) state when a control signal Hold from the buffer circuit BUF is in an H state (a high state). At this time, the latch circuits L_0 to L_7 output the input phase signals CK[0] to CK[7] without change. In addition, the latch circuits L_0 to L_7 go into a disabled (unavailable, hold) state when the control signal Hold from the buffer circuit BUF transitions from the H state to an L state (a low state). At this time, the latch circuits L_0 to L_7 latch the logic states of the input phase signals CK[0] to CK[7].

Next, the operation of the circuit of the first conventional example will be described. FIG. 16 illustrates waveforms of the reference signal Ramp, the analog signal "Signal", a start pulse StartP, the phase signals CK[0] to CK[7], the comparison signal CO, the control signal Hold from the buffer circuit BUF, and output signals Q0 to Q7 of the latch circuits L_0 to L_7 of the latch unit 1033. The lateral direction of FIG. 16 represents time, and the longitudinal direction of FIG. 16 represents voltage.

Generation of the phase signals CK[0] to CK[7] is started by a start pulse StartP at a first timing at which the comparison unit 1031 starts comparison. The generated phase signals CK[0] to CK[7] are input to the latch circuits L0 to L7 of the latch unit 1033. Since the control signal Hold from the buffer circuit BUF is in an H state, the latch circuits L0 to L7 are in an enabled state. At this time, the latch circuits L0 to L7 output the phase signals CK[0] to CK[7] without change.

The counter unit 1034 performs counting on the basis of the phase signal CK[7] output from the latch circuit L_7 of the latch unit 1033. In this counting, a count value increases or decreases at a rise or a fall timing of the phase signal CK[7]. The comparison signal CO from the comparison unit 1031 is inverted at a second timing at which a voltage of the analog signal "Signal" substantially matches a voltage of the reference signal Ramp. After the comparison signal CO is buffered by the buffer circuit BUF, the control signal Hold from the buffer circuit BUF goes into an L state at a third timing.

Accordingly, the latch circuits L0 to L7 go into a disabled state. At this time, logic states of the phase signals CK[0] to CK[7] are latched in the latch circuits L0 to L7. The counter unit 1034 causes the count value to be latched as the latch circuit L_7 stops its operation. Digital data corresponding to the analog signal "Signal" is obtained based on the logic states latched by the latch unit 1033 and the count value latched by the counter unit 1034.

As another example of an imaging device using a TDC SS-type A/D conversion circuit, the configuration disclosed in Japanese Patent Application Publication No. 2012-39386 has been proposed. FIG. 17 illustrates a part of a configuration of a TDC SS-type A/D conversion circuit of a second conventional example. The configuration and operation of the circuit illustrated in FIG. 17 will be described below.

The circuit illustrated in FIG. 17 has a comparison unit 1031, a latch control unit 1032, a latch unit 1033, and a counter unit 1034. The comparison unit 1031 and the counter unit 1034 are the same as the comparison unit 1031 and the counter unit 1034 illustrated in FIG. 15 respectively.

The latch control unit 1032 has an inversion delay circuit DLY and an AND circuit AND1. The latch control unit 1032 generates a control signal for controlling an operation of the latch unit 1033. The inversion delay circuit DLY receives an input of a comparison signal CO from the comparison unit 1031. The inversion delay circuit DLY generates a delay comparison signal xCO_D by inverting and delaying the comparison signal CO. The AND circuit AND1 receives the delay comparison signal xCO_D from the inversion delay circuit DLY and the comparison signal CO from the comparison unit 1031. The AND circuit AND1 outputs a control signal Hold_L having the logical product (AND) of the delay comparison signal xCO_D and the comparison signal CO.

The latch unit 1033 has latch circuits L_0 to L_7 and an AND circuit AND2. The latch circuits L_0 to L_7 are the same as the latch circuits L_0 to L_7 illustrated in FIG. 15. The AND circuit AND2 outputs a control signal Hold_C having the logical product (AND) of the delay comparison signal xCO_D from the inversion delay circuit DLY of the latch control unit 1032 and a control signal Enable to the latch circuit L_7.

Next, the operation of the circuit of the second conventional example will be described. FIG. 18 illustrates waveforms of a start pulse StartP, phase signals CK[0] to CK[7], the delay comparison signal xCO_D, the comparison signal CO, the control signal Hold_L from the AND circuit AND1, the control signal Enable, the control signal Hold_C from the AND circuit AND2, and output signals Q0 to Q7 of the latch circuits L_0 to L_7 of the latch unit 1033. The lateral direction of FIG. 18 represents time, and the longitudinal direction of FIG. 18 represents voltage.

Differences from the operation of the circuit of the first conventional example will be described below. After a first timing at which the comparison unit 1031 starts comparison, the comparison signal CO from the comparison unit 1031 is in an L state until voltages of an analog signal "Signal" and a reference signal Ramp input to the comparison unit 1031 substantially match each other. While the comparison signal CO is in the L state, the delay comparison signal xCO_D from the inversion delay circuit DLY is in an H state. Since the delay comparison signal xCO_D from the inversion delay circuit DLY is in the H state and the comparison signal CO from the comparison unit 1031 is in the L state, the control signal Hold_L from the AND circuit AND1 is in the L state. Thus, the latch circuits L_0 to L_6 are in a disabled state.

On the other hand, since the control signal Enable is in an H state at the first timing at which the comparison unit 1031 starts comparison, and the delay comparison signal xCO_D from the inversion delay circuit DLY is in the H state, the control signal Hold_C from the AND circuit AND2 is in an H state. Thus, the latch circuit L_7 is in an enabled state.

Subsequently, the comparison signal CO from the comparison unit 1031 is inverted at the second timing at which the voltage of the analog signal "Signal" matches the voltage of the reference signal Ramp. Since the delay comparison signal xCO_D from the inversion delay circuit DLY is in the H state and the comparison signal CO from the comparison unit 1031 changes from the L state to the H state, the control signal Hold_L of the AND circuit AND1 changes from the L state to the H state. Accordingly, the latch circuits L_0 to L_6 go into an enabled state.

Furthermore, the delay comparison signal xCO_D from the inversion delay circuit DLY changes from the H state to the L state at a third timing that arrives after a predetermined period of time elapses from the inversion of the comparison signal CO from the comparison unit 1031. Thus, since the control signal Hold_L of the AND circuit AND1 and the control signal Hold_C of the AND circuit AND2 change from an H state to an L state, the latch circuits L0 to L7 go into disabled states.

In the above-described operation, the latch circuits L_0 to L_6 operate only in the period from the second timing to the third timing. Therefore, compared with in the first conventional example, a current consumption can be reduced.

As a specific configuration of the inversion delay circuit DLY, a configuration to which a so-called delay line in which a number of inverter circuits are connected is applied may be conceived. The delay line is disclosed in, for example, ITE Technical Report Vol. 37, No. 29.

SUMMARY OF THE INVENTION

According to a first aspect of the present invention, an imaging device has an imaging unit and column circuits. A plurality of pixels having photoelectric conversion elements are disposed in a matrix shape in the imaging device. Each column circuit is disposed for one column or a plurality of columns of an array of the plurality of pixels. The column circuits output a digital signal corresponding to a pixel signal output from the pixels of the corresponding column. Each of the column circuits has a plurality of functional circuit units, a first voltage line, a second voltage line, a third voltage line, a fourth voltage line, an NMOS transistor, and a PMOS transistor. The first voltage line supplies a constant first voltage. The second voltage line supplies a second voltage that is lower than the first voltage and is constant. The third voltage line is a different voltage line from the first voltage line and the second voltage line. The third voltage line supplies a constant third voltage. The fourth voltage line is a different voltage line from the first voltage line and the second voltage line. The fourth voltage line supplies a fourth voltage that is lower than the third voltage and is constant. The first voltage line is electrically connected to a drain of the NMOS transistor, and the third voltage line is electrically connected to a gate of the NMOS transistor. The second voltage line is electrically connected to a drain of the PMOS transistor, and the fourth voltage line is electrically connected to a gate of the PMOS transistor. At least one of the plurality of functional circuit units has a logic circuit having a first power supply terminal and a second power supply terminal. The first power supply terminal is electrically connected to the source of a NMOS transistor, and the second power supply terminal is electrically connected to a source of the PMOS transistor.

According to a second aspect of the present invention, the imaging device of the first aspect may further have a clock generation unit and a reference signal generation unit. The clock generation unit outputs a plurality of phase signals. The reference signal generation unit generates a reference signal that increases or decreases with the elapse of time. The plurality of functional circuit units may include a first functional circuit unit, a second functional circuit unit, a third functional circuit unit, and a fourth functional circuit unit. The first functional circuit unit compares the pixel signal and the reference signal, and outputs a comparison signal at a timing at which the reference signal satisfies a predetermined condition for the pixel signal. The second functional circuit unit is disposed so as to correspond to the first functional circuit unit and latches logic states of the plurality of phase signals. The third functional circuit unit is disposed so as to correspond to the first functional circuit unit and generates a delay comparison signal by delaying the comparison signal by a predetermined period of time. The fourth functional circuit unit causes the second functional circuit unit to be available at a timing based on the comparison signal, and causes the second functional circuit unit to execute latching at a timing based on the delay comparison signal. The third functional circuit unit may have a plurality of logic circuits that delay and output input signals.

According to a third aspect of the present invention, the NMOS transistor and the PMOS transistor may be disposed so as to correspond to each of the plurality of logic circuits, or disposed so as to correspond to two or more logic circuits among the plurality of logic circuits in the imaging device of the first aspect.

According to a fourth aspect of the present invention, the first voltage and the third voltage may be the same. The first voltage line and the third voltage line may be disposed in common for the plurality of third functional circuit units and electrically separated from each other in each of the plurality of third functional circuit units. The second voltage and the fourth voltage may be the same. The second voltage line and the fourth voltage line may be disposed in common for the plurality of third functional circuit units and electrically separated from each other in each of the plurality of third functional circuit units.

According to a fifth aspect of the present invention, the first voltage and the third voltage may be the same. The first voltage line and the third voltage line may be disposed in common for the plurality of column circuits and electrically separated from each other in each of the plurality of column circuits. The second voltage and the fourth voltage may be the same. The second voltage line and the fourth voltage line may be disposed in common for the plurality of column circuits and electrically separated from each other in each of the plurality of column circuits.

According to a sixth aspect of the present invention, a back gate of the NMOS transistor may be electrically connected to a fifth voltage line that supplies a constant fifth voltage that is different from the second voltage in the imaging device of the first or second aspect. A back gate of the PMOS transistor may be electrically connected to a sixth voltage line that supplies a constant sixth voltage that is different from the first voltage.

According to a seventh aspect of the present invention, the functional circuit unit having the logic circuits may latch the digital signal in the imaging device of the first aspect.

According to an eighth aspect of the present invention, the functional circuit unit having the logic circuits may perform counting according to the number of delay circuits through which a pulse signal has passed for a predetermined period of time in the imaging device of the first aspect.

According to a ninth aspect of the present invention, an imaging system has the imaging device.

DETAILED DESCRIPTION OF THE INVENTION

Embodiments of the present invention will be described with reference to the drawings.

First Embodiment

Figure 1:
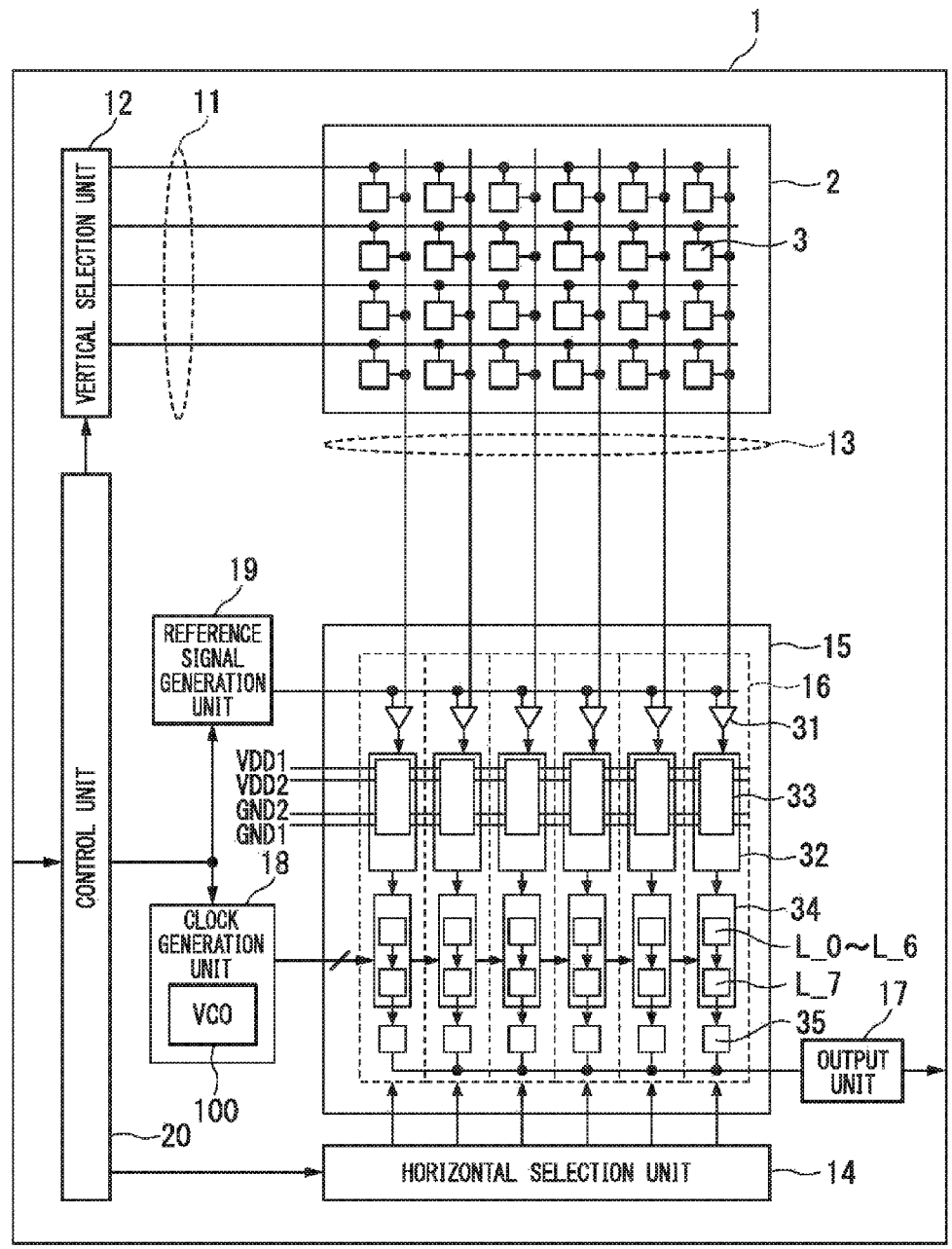
FIG. 1 is a block diagram illustrating a configuration of an imaging device according to a first embodiment of the present invention.

FIG. 1 illustrates an example of a configuration of an imaging device 1 according to a first embodiment of the present invention. The imaging device 1 has an imaging unit 2, a vertical selection unit 12, a horizontal selection unit 14, a column processing unit 15, an output unit 17, a clock generation unit 18, a reference signal generation unit 19, and a control unit 20 as illustrated in FIG. 1.

The imaging unit 2 has a plurality of unit pixels 3 arrayed in a matrix shape. The unit pixels 3 generate pixel signals according to an amount of incident electromagnetic waves. The unit pixels 3 output pixel signals to vertical signal lines 13 provided for respective columns of the array of the plurality of unit pixels 3. The vertical selection unit 12 selects each row of the array of the plurality of unit pixels 3. The clock generation unit 18 generates a plurality of phase signals having different phases. The reference signal generation unit 19 generates a reference signal (ramp wave) that increases or decreases with the elapse of time. The column processing unit performs A/D conversion on pixel signals output from the unit pixels 3. The horizontal selection unit 14 reads A/D converted digital data into horizontal signal lines. The output unit 17 outputs the digital data read by the horizontal selection unit 14 to a circuit in a later stage. The control unit 20 controls the respective units.

The imaging unit 2 having the unit pixels 3 in 4 rows×6 columns is illustrated in FIG. 1 for the sake of simplicity. The number of rows or columns in the array of the unit pixels 3 can be any natural number as long as it is greater than or equal to 2. In reality, the imaging unit 2 has several dozens or several tens of thousands of unit pixels 3 disposed in rows and columns. The unit pixels 3 have photoelectric conversion elements such as photodiodes, photogates, phototransistors, and the like and transistor circuits.

More detailed description of the respective units will be provided below. In the imaging unit 2, the unit pixels 3 are two-dimensionally disposed in 4 rows and 6 columns. In addition, row control lines 11 are wired for the respective rows of the array of the plurality of unit pixels 3. One end of each of the row control lines 11 is connected to the output of the vertical selection unit 12 corresponding to each row. The vertical selection unit 12 has a shift register, a decoder, and the like. When the unit pixels 3 of the imaging unit 2 are driven, the vertical selection unit 12 performs control over row addresses and row scanning of the imaging unit 2 via the row control lines 11. The vertical signal lines 13 are disposed for respective columns of the array of the plurality of unit pixels 3.

The column processing unit 15 has a plurality of column A/D conversion units 16 (column circuits). For example, the plurality of column A/D conversion units 16 are disposed for respective columns of the plurality of unit pixels 3, i.e., the respective vertical signal lines 13. The column A/D conversion units 16 convert analog pixel signals that have been read from the respective unit pixels 3 of the imaging unit 2 via the vertical signal lines 13 for the respective columns of the plurality of unit pixels 3 into digital data. In the present example, one column A/D conversion unit 16 is disposed for one column of the array of the plurality of unit pixels 3. This is an example, and correspondence between the array of the plurality of unit pixels 3 and the column A/D conversion units 16 is not limited to that relationship. For example, one column A/D conversion unit 16 can be disposed for a plurality of columns of the array of the plurality of unit pixels 3, and this one column A/D conversion unit 16 can be used for the plurality of columns in a time-dividing manner. The column processing unit 15, the output unit 17, the clock generation unit 18, and the reference signal generation unit 19 constitute an analog-digital conversion means (A/D conversion circuit) that converts analog pixel signals read from unit pixels 3 of a selected row into digital pixel data.

The clock generation unit 18 has a voltage controlled oscillator (VCO) 100, which is a ring delay circuit in which a plurality of delay units (inversion elements) are connected in a ring shape and which is a symmetric oscillation circuit. The VCO 100 outputs a plurality of phase signals from the respective delay units, each signal having a fixed phase difference. An asymmetric oscillation circuit of which the number of output phase signals is a power of 2, or the like may also be used in the clock generation unit 18. A ring delay circuit is suitable as the clock generation unit 18. However, it is not limited thereto.

For example, the reference signal generation unit 19 has an integrating circuit. The reference signal generation unit 19 generates a reference signal whose level changes in a slope shape with the elapse of time, which is a so-called ramp wave, according to control of the control unit 20. The reference signal generation unit 19 supplies the reference signal to the column A/D conversion units 16 of the column processing unit 15 via a reference signal line. The reference signal generation unit 19 is not limited to a circuit that uses an integrating circuit. A DAC circuit may be used in the reference signal generation unit 19. When a ramp wave is generated digitally using a DAC circuit, it is desirable for the ramp wave to have finer steps, or to have a property equivalent thereto.

The horizontal selection unit 14 has a shift register, a decoder, or the like. The horizontal selection unit 14 performs control over column addresses and column scanning of the column A/D conversion units 16 of the column processing unit 15. Pieces of digital data A/D converted by the column A/D conversion units 16 are sequentially read into the output unit 17 via the horizontal signal lines according to the control of the horizontal selection unit 14.

The control unit 20 has a functional block of a timing generator (TG) and a functional block for performing communication with this TG. The TG supplies a pulse signal of a predetermined timing or a clock signal necessary for operations of respective units such as the vertical selection unit 12, the clock generation unit 18, the reference signal generation unit 19, the horizontal selection unit 14, the column processing unit 15, and the output unit 17.

The output unit 17 outputs binarized digital data. The output unit 17 has a buffering function. In addition, the output unit 17 may include signal processing functions of, for example, black level adjustment, column unevenness correction, color processing, and the like. Furthermore, the output unit 17 may convert n-bit parallel digital data into serial data and output the serial data.

Next, a configuration of the column A/D conversion units 16 will be described. The column A/D conversion units 16 compare analog pixel signals read from the unit pixels 3 to the reference signal from the reference signal generation unit 19, and generate pulse signals having sizes in the time axis direction (pulse widths) according to the sizes of the pixel signals. The column A/D conversion units 16 perform A/D conversion by generating digital data corresponding to the periods of the pulse widths of the pulse signals.

Details of the configuration of the column A/D conversion units 16 will be described. The column A/D conversion units 16 are disposed for respective columns of the array of the plurality of unit pixels 3. In FIG. 1, six column A/D conversion units 16 are disposed. The column A/D conversion units 16 in the respective columns are the same. Each of the column A/D conversion units 16 has a plurality of functional circuit units. The plurality of functional circuit units of each column A/D conversion unit 16 are a comparison unit 31 (a first functional circuit unit), a latch control unit 32 (a fourth functional circuit unit), a comparison delay unit 33 (a third functional circuit unit), a latch unit 34 (a second functional circuit unit), and a counter unit 35.

The comparison units 31 are disposed so as to correspond to the columns of the array of the plurality of unit pixels 3. One column A/D conversion unit 16 may be disposed for a plurality of columns of the array of the plurality of unit pixels 3 as described above. Therefore, one comparison unit 31 may be disposed for a plurality of columns of the plurality of unit pixels 3. That is, the comparison unit 31 is disposed for one column or for a plurality of columns of the array of the plurality of unit pixels 3.

The comparison unit 31 compares a signal voltage according to an analog pixel signal output from the unit pixels 3 of the imaging unit 2 via the vertical signal lines 13 to a ramp voltage of the reference signal supplied from the reference signal generation unit 19. Accordingly, the comparison unit 31 converts the size of the pixel signal into information of the time axis direction (the pulse width of a pulse signal). For example, a comparison signal output by the comparison unit 31 goes into a high level (H level) when the ramp voltage is higher than the signal voltage, or goes into a low level (L level) when the ramp voltage is lower than or equal to the signal voltage.

The comparison unit 31 starts the process of comparing the pixel signal output from the unit pixels 3 to the reference signal (a comparison process) at a first timing. In addition, the comparison unit 31 finishes the comparison process at a second timing at which the reference signal satisfies a predetermined condition for the pixel signal. In the present example, the second timing is a timing at which the reference signal substantially matches the voltage of the pixel signal. A comparison signal from the comparison unit 31 is inverted at the timing at which the comparison unit 31 finishes the comparison process. Thus, the comparison unit 31 compares the pixel signal and the reference signal, and outputs the comparison signal at the timing at which the reference signal satisfies the predetermined condition for the pixel signal.

The latch control unit 32, the comparison delay unit 33, the latch unit 34, and the counter unit 35 are disposed so as to correspond to the comparison unit 31. The latch unit 34 has a plurality of latch circuits L_0 to L_7. The plurality of latch circuits L_0 to L_7 latch (hold or store) logic states of a plurality of phase signals output from the clock generation unit 18. Thus, the latch unit 34 latches the logic states of the plurality of phase signals. Encoding is performed in the output unit 17 on the basis of the logic states of the plurality of phase signals latched in the latch unit 34. Accordingly, data of low-order bits (low-order data) constituting the digital data is obtained.

The latch control unit 32 generates a control signal for controlling an operation of the latch unit 34. The latch control unit 32 has the comparison delay unit 33. The comparison delay unit 33 generates a delay comparison signal by delaying a comparison signal from the comparison unit 31 by a predetermined period of time. A first voltage VDD1, a second voltage GND1, a third voltage VDD2, and a fourth voltage GND2 are supplied to the comparison delay unit 33. These voltages will be described below.

The latch control unit 32 causes the latch unit 34 to be available at the second timing at which the comparison signal from the comparison unit 31 is inverted. After the second timing, the latch control unit 32 causes the latch unit 34 to perform latching at a third timing based on the delay comparison signal from the comparison delay unit 33. That is, the latch control unit 32 causes the latch unit 34 to be available at the timing based on the inverted comparison signal, and causes the latch unit 34 to perform latching based on the delay comparison signal corresponding to the comparison signal.

The counter unit 35 performs counting on the basis of a phase signal output from the clock generation unit 18. The counter section unit 35 performs counting on the basis of the phase signal CK[7] in the present example. As the counter unit 35 performs counting, data of upper-order bits (upper-order data) constituting the digital data is obtained.

Signals according to the logic states of the plurality of phase signals CK[0] to CK[7] latched in the latch unit 34 constitute, for example, 8-bit data. In addition, a signal according to a count value of the counter unit 35 constitutes, for example, 10-bit data. The 10-bit is an example, and a number of bits fewer than 10 bits (for example, 8 bits), a number of bits greater than 10 bits (for example, 12 bits), or the like is possible.

Next, an operation of the present example will be described. Here, description of a specific operation of the unit pixels 3 will be omitted. The unit pixels 3 output reset levels and signal levels as is well known in the art.

A/D conversion is performed as follows. For example, voltages of a reference signal falling in a predetermined slope and a pixel signal are compared. The length of a period from the first timing at which this comparison starts to the third timing that arrives after a predetermined period of time elapses from the second timing at which the voltage (ramp voltage) of the reference signal matches the voltage of the pixel signal is measured. This measurement is based on a count value of the counter unit 35 and the logic states of the plurality of phase signals CK[0] to CK[7] latched in the latch unit 34. Accordingly, digital data corresponding to the size of the pixel signal is obtained.

In the present example, the A/D conversion is performed on a respective reset level and signal level read from the unit pixels 3. Specifically, a reset level including noise of pixel signals 3 is read from the unit pixels 3 in a selected row through a first reading operation, and then A/D-conversion is performed thereon. Subsequently, a signal level according to electromagnetic waves incident on the unit pixels 3 is read through a second reading operation, and then A/D conversion is performed thereon. Then, by performing subtraction of the reset level from the signal level (a CDS process) digitally, digital data according to signal components is obtained. It does not matter whether reading of the signal level is performed in the first reading operation and A/D conversion, or reading of the reset level is performed in the second reading operation and A/D conversion. In addition, the process needs not be limited thereto.

(First Reading)

After a pixel signal (reset level) output from the unit pixels 3 in an arbitrary row of the array of the plurality of unit pixels 3 to the vertical signal lines 13 is stabilized, the control unit 20 supplies control data for generating a reference signal to the reference signal generation unit 19. Accordingly, the reference signal generation unit 19 outputs the reference signal the waveform of which changes into a ramp shape as a whole as time passes. The reference signal is given to a first input terminal of the comparison unit 31. The pixel signal is given to a second input terminal of the comparison unit 31. The comparison unit 31 compares this reference signal and the pixel signal. The latch control unit 32 sets the latch circuit L_7 of the latch unit 34 to be in an enabled (available, toggled) state at a timing at which the comparison unit 31 starts the comparison (the first timing). Further, the counter unit 35 performs counting using the phase signal CK[7] from the clock generation unit 18 as a counting clock.

The comparison unit 31 compares the reference signal given from the reference signal generation unit 19 and the pixel signal, and when voltages of both signals substantially match each other (the second timing), the comparison signal is inverted. When the comparison signal from the comparison unit 31 is inverted, the latch control unit 32 causes the latch circuits L_0 to L_6 of the latch unit 34 to be in the enabled state.

When a control signal from the latch control unit 32 has been inverted (the third timing) after the comparison signal from the comparison unit 31 has been inverted, the latch circuits L_0 to L_7 of the latch unit 34 go into a disabled (unavailable, hold) state. Accordingly, the latch circuits L_0 to L_7 of the latch unit 34 latch logic states of the plurality of phase signals CK[0] to CK[7] from the clock generation unit 18. At the same time, the counter unit 35 latches a count value. Accordingly, digital data according to the reset level is obtained. When a predetermined period of time elapses, the control unit 20 causes the supply of the control data to the reference signal generation unit 19 and output of the phase signals from the clock generation unit 18 to stop. Thus, the reference signal generation unit 19 stops generating the reference signal.

(Second Reading)

After a pixel signal (signal level) output from the unit pixels 3 of the arbitrary row of the array of the plurality of unit pixels 3 to the vertical signal lines 13 is stabilized, the control unit 20 supplies control data for generating a reference signal to the reference signal generation unit 19. Thus, the reference signal generation unit 19 outputs the reference signal the waveform of which changes in a ramp shape as a whole as time passes. The reference signal is given to the first input terminal of the comparison unit 31. The pixel signal is given to the second input terminal of the comparison unit 31. The comparison unit 31 compares this reference signal and pixel signal. The latch control unit 32 causes the latch circuit L_7 of the latch unit 34 to be in an enabled state at the timing at which the comparison unit 31 starts comparison (the first timing). In addition, the counter unit 35 performs counting using the phase signal CK[7] from the clock generation unit 18 as a counting clock.

When the comparison unit 31 compares the reference signal given from the reference signal generation unit 19 to the pixel signal and voltages of both signals substantially match each other (the second timing), the comparison signal is inverted. When the comparison signal from the comparison unit 31 has been inverted, the latch control unit 32 causes the latch circuits L_0 to L_6 of the latch unit 34 to be in an enabled state.

When a control signal from the latch control unit 32 has been inverted after the comparison signal from the comparison unit 31 has been inverted (a third timing), the latch circuits L_0 to L_7 of the latch unit 34 go into a disabled state. Thus, the latch circuits L_0 to L_7 of the latch unit 34 latch logic states of the plurality of phase signals CK[0] to CK[7] from the clock generation unit 18. At the same time, the counter unit latches a count value. Accordingly, digital data according to the signal level is obtained. When a predetermined period of time elapses, the control unit 20 causes the supply of the control data to the reference signal generation unit 19 and output of the phase signals from the clock generation unit 18 to stop. Thus, the reference signal generation unit 19 stops generating the reference signal.

The digital data according to the reset level and the digital data according to the signal level are transferred by the horizontal selection unit 14 to the output unit 17 via the horizontal signal lines. Digital data of signal components are obtained as the output unit 17 performs an encoding process and subtraction (a CDS process) based on the aforementioned digital data. The output unit 17 may be built into the column processing unit 15.

Figure 2:
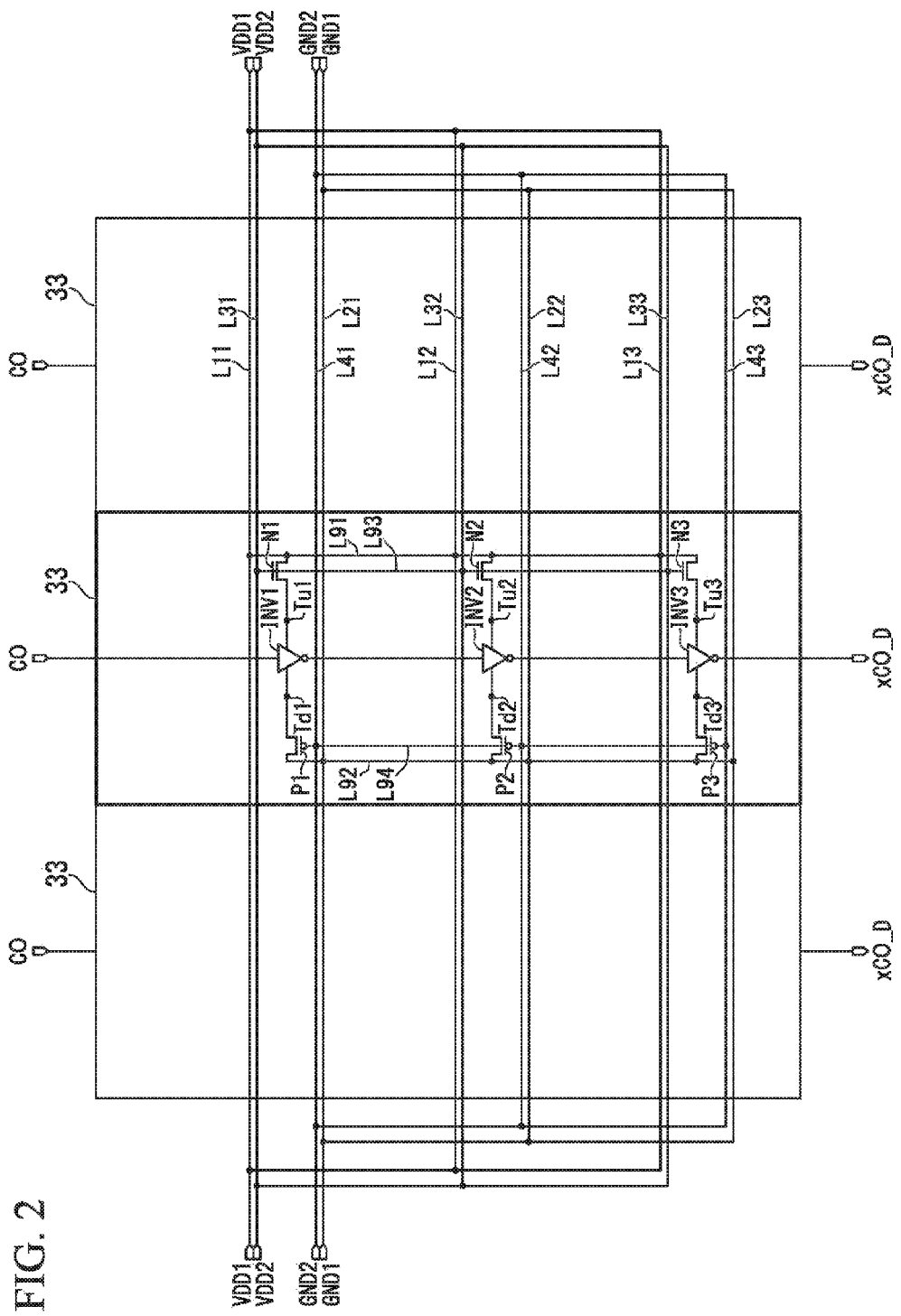
FIG. 2 is a circuit diagram illustrating a configuration of a comparison delay unit according to the first embodiment of the present invention.

Next, details of a configuration of the comparison delay unit 33 will be described. FIG. 2 illustrates an example of the configuration of the comparison delay unit 33. In FIG. 2, three comparison delay units 33 corresponding to three columns of the array of the plurality of unit pixels 3 are illustrated. The three comparison delay units 33 are the same. In FIG. 2, only the configuration of the central comparison delay unit 33 among the three comparison delay units 33 is illustrated. The configurations of the other two comparison delay units 33 are omitted for the sake of convenience.

As illustrated in FIG. 2, the comparison delay unit 33 has inverter circuits INV1, INV2, and INV3, NMOS transistors N1, N2, and N3, PMOS transistors P1, P2, and P3, first voltage lines L11, L12, and L13, second voltage lines L21, L22, and L23, third voltage lines L31, L32, and L33, fourth voltage lines L41, L42, and L43, and voltage lines L91, L92, L93, and L94. The voltage lines L91, L92, L93, and L94 are not necessarily required.

The comparison delay unit 33 has the plurality of inverter circuits INV1, INV2, and INV3 which delay and output input signals. The inverter circuits INV1, INV2, and INV3 are logic circuits of the comparison delay unit 33. The inverter circuits INV1, INV2, and INV3 are connected to each other in series. The inverter circuits INV1, INV2, and INV3 invert an input signal.

Each of the inverter circuits INV1, INV2, and INV3 has an input terminal and an output terminal. The comparison signal CO from the comparison unit 31 is input to the input terminal of the inverter circuit INV1. A signal output from the output terminal of the inverter circuit INV1 is input to the input terminal of the inverter circuit INV2. A signal output from the output terminal of the inverter circuit INV2 is input to the input terminal of the inverter circuit INV3. The delay comparison signal xCO_D is output from the output terminal of the inverter circuit INV3. The three inverter circuits are illustrated in FIG. 2. The comparison delay unit 33 may have one or two inverter circuits, or have four or more inverter circuits.

The inverter circuit INV1 has a first power supply terminal Tu1 and a second power supply terminal Td1. The inverter circuit INV2 has a first power supply terminal Tu2 and a second power supply terminal Td2. The inverter circuit INV3 has a first power supply terminal Tu3 and a second power supply terminal Td3. The first power supply terminal Tu1 of the inverter circuit INV1 is electrically connected to the source of the NMOS transistor N1. The second power supply terminal Td1 of the inverter circuit INV1 is electrically connected to the source of the PMOS transistor P1. The first power supply terminal Tu2 of the inverter circuit INV2 is electrically connected to the source of the NMOS transistor N2. The second power supply terminal Td2 of the inverter circuit INV2 is electrically connected to the source of the PMOS transistor P2. The first power supply terminal Tu3 of the inverter circuit INV3 is electrically connected to the source of the NMOS transistor N3. The second power supply terminal Td3 of the inverter circuit INV3 is electrically connected to the source of the PMOS transistor P3. Delay times between input signals and output signals of the inverter circuits INV1, INV2, and INV3 change according to the sizes of the differences between voltages supplied to the first power supply terminals Tu1, Tu2, and Tu3, and the second power supply terminals Td1, Td2, and Td3.

The first voltage lines L11, L12, and L13, the second voltage lines L21, L22, and L23, the third voltage lines L31, L32, and L33, and the fourth voltage lines L41, L42, and L43 are disposed in the horizontal direction (the lateral direction of FIG. 2). The voltage lines L91, L92, L93, and L94 are disposed in the vertical direction (the longitudinal direction of FIG. 2).

The drain of the NMOS transistor N1 is electrically connected to the first voltage line L11. The gate of the NMOS transistor N1 is electrically connected to the third voltage line L31. The drain of the NMOS transistor N2 is electrically connected to the first voltage line L12. The gate of the NMOS transistor N2 is electrically connected to the third voltage line L32. The drain of the NMOS transistor N3 is electrically connected to the first voltage line L13. The gate of the NMOS transistor N3 is electrically connected to the third voltage line L33.

The drain of the PMOS transistor P1 is electrically connected to the second voltage line L21. The gate of the PMOS transistor P1 is electrically connected to the fourth voltage line L41. The drain of the PMOS transistor P2 is electrically connected to the second voltage line L22. The gate of the PMOS transistor P2 is electrically connected to the fourth voltage line L42. The drain of the PMOS transistor P3 is electrically connected to the second voltage line L23. The gate of the PMOS transistor P3 is electrically connected to the fourth voltage line L43.

The first voltage lines L11, L12, and L13 and the third voltage lines L31, L32, and L33 are disposed in common for the plurality of comparison delay units 33. In the present example, the first voltage lines L11, L12, and L13 and the third voltage lines L31, L32, and L33 are disposed to traverse the plurality of comparison delay units 33 lined up in the horizontal direction (the lateral direction of FIG. 3). In addition, the first voltage lines L11, L12, and L13 and the third voltage lines L31, L32, and L33 are electrically separated from each other in each of the plurality of comparison delay units 33.

The second voltage lines L21, L22, and L23 and the fourth voltage lines L41, L42, and L43 are disposed in common for the plurality of comparison delay units 33. In the present example, the second voltage lines L21, L22, and L23 and the fourth voltage lines L41, L42, and L43 are disposed to traverse the plurality of comparison delay units 33 lined up in the horizontal direction (the lateral direction of FIG. 3). In addition, the second voltage lines L21, L22, and L23 and the fourth voltage lines L41, L42, and L43 are electrically separated from each other in each of the plurality of comparison delay units 33.

The first voltage line L12 and the first voltage line L13 are connected to the first voltage line L11 outside of the region in which the comparison delay units 33 are disposed. The second voltage line L22 and the second voltage line L23 are connected to the second voltage line L21 outside of the region in which the comparison delay units 33 are disposed. The third voltage line L32 and the third voltage line L33 are connected to the third voltage line L31 outside of the region in which the comparison delay units 33 are disposed. The fourth voltage line L42 and the fourth voltage line L43 are connected to the fourth voltage line L41 outside of the region in which the comparison delay units 33 are disposed.

A first voltage VDD1 is applied to the first voltage line L11 outside of the region in which the comparison delay units 33 are disposed. The first voltage VDD1 is a constant voltage. The first voltage VDD1 is, for example, a power supply voltage input to the imaging device 1 from outside of the imaging device 1. Thus, the first voltage lines L11, L12, and L13 supply the constant first voltage VDD1 to the drains of the NMOS transistors N1, N2, and N3 respectively.

A second voltage GND1 is applied to the second voltage line L21 outside of the region in which the comparison delay units 33 are disposed. The second voltage GND1 is a constant voltage lower than the first voltage VDD1. The second voltage GND1 is, for example, a ground voltage input to the imaging device 1 from the outside of the imaging device 1. Thus, the second voltage lines L21, L22, and L23 supply the second voltage GND1 that is lower than the first voltage VDD1 and is constant to the drains of the PMOS transistors P1, P2, and P3 respectively. In addition, the second voltage GND1 is a constant voltage lower than a third voltage VDD2.

The third voltage VDD2 is applied to the third voltage line L31 outside of the region in which the comparison delay units 33 are disposed. The third voltage VDD2 is a constant voltage. In addition, the third voltage VDD2 is the same as the first voltage VDD1, or different from the first voltage VDD1. The third voltage VDD2 is, for example, a power supply voltage input to the imaging device 1 from the outside of the imaging device 1. Thus, the third voltage lines L31, L32, and L33 supply the constant third voltage VDD2 to the gates of the NMOS transistors N1, N2, and N3 respectively.

A fourth voltage GND2 is applied to the fourth voltage line L41 outside of the region in which the comparison delay units 33 are disposed. The fourth voltage GND2 is a constant voltage lower than the third voltage VDD2. In addition, the fourth voltage GND2 is the same as the second voltage GND1, or different from the second voltage GND1. The fourth voltage GND2 is, for example, a ground voltage input to the imaging device 1 from the outside of the imaging device 1. Thus, the fourth voltage lines L41, L42, and L43 supply the fourth voltage GND2 that is lower than the third voltage VDD2 and is constant to the gates of the PMOS transistors P1, P2, and P3 respectively. Furthermore, the fourth voltage GND2 is a constant voltage lower than the first voltage VDD1.

The voltage line L91 is connected to the first voltage lines L11, L12, and L13. The drains of the NMOS transistors N1, N2, and N3 are connected in common to the voltage line L91. The voltage line L92 is connected to the second voltage lines L21, L22, and L23. The drains of the PMOS transistors P1, P2, and P3 are connected in common to the voltage line L92. The voltage line L93 is connected to the third voltage lines L31, L32, and L33. The gates of the NMOS transistors N1, N2, and N3 are connected in common to the voltage line L93. The voltage line L94 is connected to the fourth voltage lines L41, L42, and L43. The gates of the PMOS transistors P1, P2, and P3 are connected in common to the voltage line L94.

The disposition of the voltage lines illustrated in FIG. 2 is an example. Disposition of the voltage lines is not limited thereto.

Next, a principle of reducing the influence of the power supply bounce and the ground bounce on the inverter circuits INV1, INV2, and INV3 constituting the comparison delay unit 33 and its effect will be described. Drain voltages of the NMOS transistors N1, N2, and N3 are determined with the first voltage VDD1. In addition, a channel potential of the NMOS transistors N1, N2, and N3 is determined according to the third voltage VDD2 input to their gates. Likewise, Drain voltages of the PMOS transistors P1, P2, and P3 are determined with the second voltage GND1. In addition, a channel potential of the PMOS transistors P1, P2, and P3 is determined according to the fourth voltage GND2 input to their gates.

A substantial power supply voltage of the inverter circuits INV1, INV2, and INV3 is a voltage of the first power supply terminals Tu1, Tu2, and Tu3, i.e., a source voltage of the NMOS transistors N1, N2, and N3. The source voltage of the NMOS transistors is determined according to the channel potential of the NMOS transistors. Likewise, a substantial ground voltage of the inverter circuits INV1, INV2, and INV3 is a voltage of the second power supply terminals Td1, Td2, and Td3, i.e., a source voltage of the PMOS transistors P1, P2, and P3. The source voltage of the PMOS transistors P1, P2, and P3 is determined according to the channel potential of the PMOS transistors P1, P2, and P3. That is, the substantial power supply voltage and ground voltage of the inverter circuits INV1, INV2, and INV3 are determined according to the third voltage VDD2 and the fourth voltage GND2. Thus, by controlling the third voltage VDD2 and the fourth voltage GND2, the substantial power supply voltage and ground voltage of the inverter circuits INV1, INV2, and INV3 can be controlled.

A current input to the comparison delay unit 33 flows to inverter circuits INV1, INV2, and INV3 by way of the first voltage lines L11, L12, and L13 and the NMOS transistors N1, N2, and N3. Further, a current output from the inverter circuits INV1, INV2, and INV3 is output from the comparison delay unit 33 by way of the PMOS transistors P1, P2, and P3 and the second voltage lines L21, L22, and L23.

When a comparison signal CO from the comparison unit 31 is inverted, currents flowing in the NMOS transistors N1, N2, and N3 and the PMOS transistors P1, P2, and P3 change due to a change in states of the inverter circuits INV1, INV2, and INV3. When comparison signals CO from the comparison units 31 that correspond to a number of columns of the array of the plurality of unit pixels 3 are inverted substantially at the same time, a change in the current occurs in the comparison delay units 33 that correspond to the number of columns. Thus, the drain voltages of the NMOS transistors N1, N2, and N3 and the drain voltages of the PMOS transistors P1, P2, and P3 change.

When a general NMOS transistor operates in a saturation region, for example, a drain current of the NMOS transistor $I_{d,n}$ is expressed by Formula (1). $\beta_n$ is a coefficient. $V_{g,n}$ is a gate voltage of the NMOS transistor. $V_{s,n}$ is a source voltage of the NMOS transistor. $V_{th,n}$ is a threshold voltage of the NMOS transistor.

[Math. 1]

$$I_{d,n} = \tfrac{1}{2} \times \beta_n \times (V_{g,n} - V_{s,n} - V_{th,n})^2 \qquad (1)$$

When a general PMOS transistor operates in a saturation region, for example, a drain current of the PMOS transistor $I_{d,p}$ is expressed by Formula (2). $\beta_p$ is a coefficient. $V_{s,p}$ is a source voltage of the PMOS transistor. $V_{g,p}$ is a gate voltage of the PMOS transistor. $V_{th,p}$ is a threshold voltage of the PMOS transistor.

[Math. 2]

$$I_{d,p} = \tfrac{1}{2} \times \beta_p \times (V_{s,p} - V_{g,p} + V_{th,p})^2 \qquad (2)$$

Formula (1) does not include a drain voltage of the NMOS transistor. That is, the drain voltage affects the drain current of the NMOS transistor very little. Thus, when a drain voltage of the NMOS transistor transiently changes under the condition in which a state in which a drain voltage of the NMOS transistor is higher than a channel potential is maintained, the drain current of the NMOS transistor barely changes. As a result, a change in the drain voltage of the NMOS transistor affects a source voltage thereof very little. Consequently, the influence of the power supply bounce on the substantial power supply voltage of the inverter circuits INV1, INV2, and INV3 is very little.

Likewise, Formula (2) does not include a drain voltage of the PMOS transistor. That is, the drain voltage affects the drain current of the PMOS transistor very little. Thus, when a drain voltage of the PMOS transistor transiently changes under the condition in which a state in which the drain voltage of the PMOS transistor is lower than a channel potential is maintained, the drain current of the PMOS transistor barely changes. As a result, a change in the drain voltage of the PMOS transistor affects a source voltage thereof very little. Consequently, the influence of the ground bounce on the substantial ground voltage of the inverter circuits INV1, INV2, and INV3 is very little.

Thus, even when the comparison signals CO from a number of comparison units 31 change substantially at the same time, if the power supply bounce and the ground bounce are lower than or equal to a predetermined voltage, it is possible to greatly reduce the influence of bounce on the power supply voltage and the ground voltage of the inverter circuits INV1, INV2, and INV3. For example, when the comparison delay units 33 are configured to have a power supply voltage of 3.3 [V], it is possible to configure the comparison delay units 33 so that a delay function is maintained and the influence of the bounce is substantially removed with respect to bounce of about 1.0 [V].

On top of that, the third voltage VDD2 and the fourth voltage GND2 may be controlled such that the difference between the substantial power supply voltage and the ground voltage decreases. Accordingly, the current flowing through the inverter circuits INV1, INV2, and INV3 can be reduced. As a result, it is possible to reduce the power supply bounce and the ground bounce. That is, the influence of the bounce on the power supply voltage and the ground voltage of the inverter circuits INV1, INV2, and INV3 can be further reduced.

Modified Example

Figure 3:
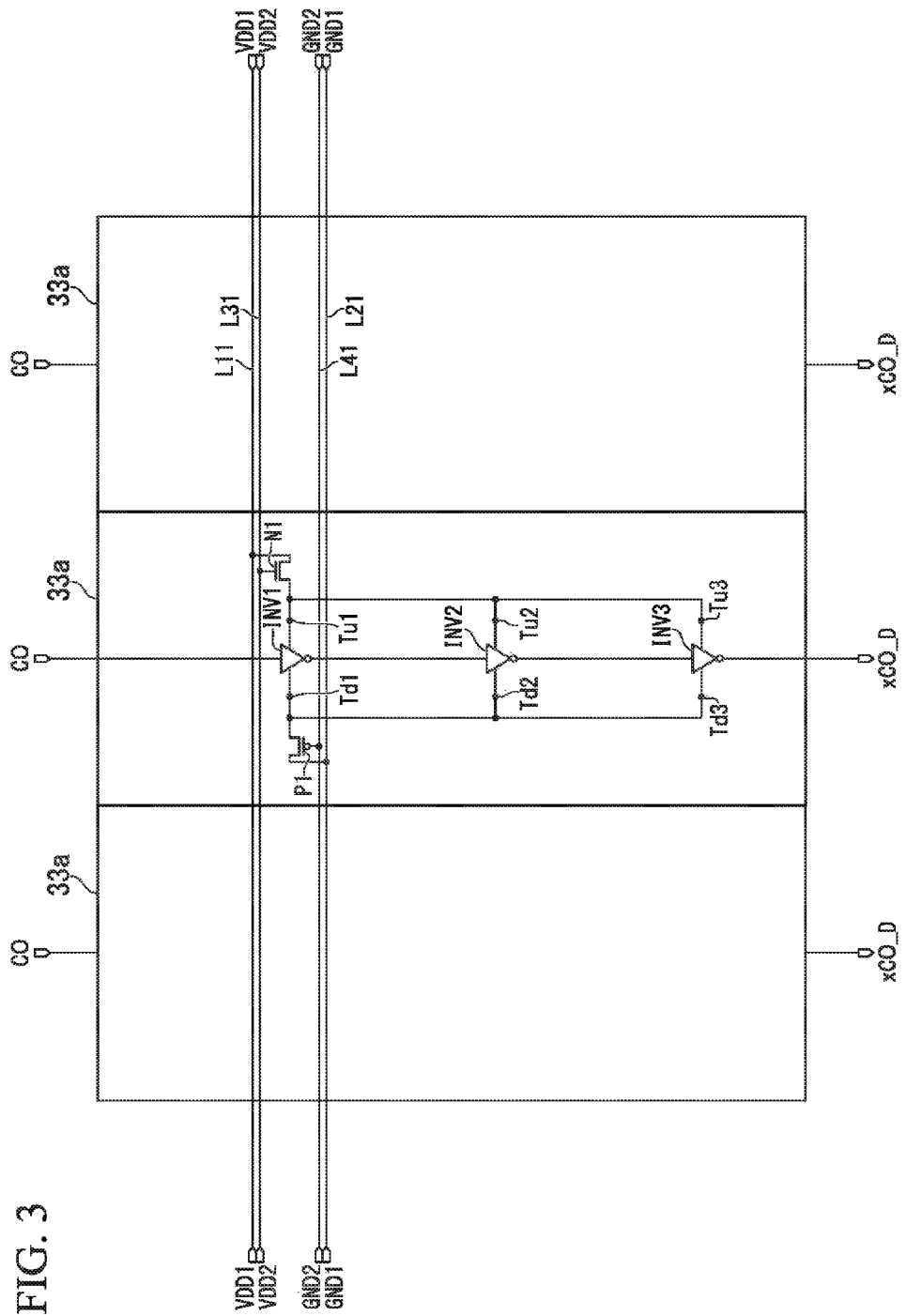
FIG. 3 is a circuit diagram illustrating another configuration of a comparison delay unit according to the first embodiment of the present invention.

FIG. 3 illustrates a configuration of a comparison delay unit 33a that is an example of another configuration of the comparison delay unit 33. In FIG. 3, the three comparison delay units 33a corresponding to three columns of the array of the plurality of the unit pixels 3 are illustrated. The three comparison delay units 33a are the same. In FIG. 3, only the configuration of the central comparison delay unit 33a among the three comparison delay units 33a is illustrated. The configurations of the other two comparison delay units 33a are omitted for the sake of convenience.

As illustrated in FIG. 3, the comparison delay unit 33a has the inverter circuits INV1, INV2, and INV3, the NMOS transistor N1, the PMOS transistor P1, the first voltage line L11, the second voltage line L21, the third voltage line L31, and the fourth voltage line L41.

Differences of the configuration illustrated in FIG. 3 from that illustrated in FIG. 2 will be described. The NMOS transistors N2 and N3, the PMOS transistors P2 and P3, the first voltage lines L12 and L13, the second voltage lines L22 and L23, the third voltage lines L32 and L33, the fourth voltage lines L42 and L43, and the voltage lines L91, L92, L93, and L94 are not disposed in the configuration illustrated in FIG. 3.

The first power supply terminals Tu1, Tu2, and Tu3 of the inverter circuits INV1, INV2, and INV3 are electrically connected in common to the source of the NMOS transistor N1. The second power supply terminals Td1, Td2, and Td3 of the inverter circuits INV1, INV2, and INV3 are electrically connected in common to the source of the PMOS transistor P1. In the configuration illustrated in FIG. 2, the NMOS transistors N1, N2, and N3 and the PMOS transistors P1, P2, and P3 are disposed so as to correspond to the inverter circuits INV1, INV2, and INV3 respectively. However, in the configuration illustrated in FIG. 3, the NMOS transistor N1 and the PMOS transistor P1 are disposed so as to correspond to two or more (three in FIG. 3) of the inverter circuits INV1, INV2, and INV3. That is, the number of inverter circuits may not be the same as the number of NMOS transistors. In addition, the number of inverter circuits may not be the same as the number of PMOS transistors.

Details of the configuration illustrated in FIG. 3 other than those described above are substantially the same as those of the configuration illustrated in FIG. 2.

The vertical selection unit 12, the horizontal selection unit 14, the output unit 17, and the control unit 20 of the imaging device 1 are not characteristic configurations of a TDC SS-type A/D conversion circuit. In addition, these configurations are not essential for obtaining the characteristic effect of the first embodiment. Furthermore, the clock generation unit 18 and the reference signal generation unit 19 are not configurations for obtaining the characteristic effect of the first embodiment. Moreover, the counter units are not essential for obtaining the characteristic effect of the first embodiment.

According to the first embodiment, the imaging device 1 has the imaging unit 2 and the column circuits (the column A/D conversion units 16). The imaging unit 2 has the plurality of pixels (the unit pixels 3) disposed in a matrix shape. Each of the plurality of pixels has a photoelectric conversion element. Each of the column circuits is disposed for one column or a plurality of columns of an array of the plurality of pixels. The column circuits output digital signals corresponding to pixel signals output from the pixels of the corresponding column. Each column circuit has the plurality of functional circuit units (the comparison unit 31, the latch control unit 32, the comparison delay unit 33 or 33a, and the latch unit 34), the first voltage lines L11, L12, and L13, the second voltage lines L21, L22, and L23, the third voltage lines L31, L32, and L33, the fourth voltage lines L41, L42, and L43, the NMOS transistors N1, N2, and N3, and the PMOS transistors P1, P2, and P3. The first voltage lines L11, L12, and L13 supply the constant first voltage VDD1. The second voltage lines L21, L22, and L23 supply the second voltage GND1 that is lower than the first voltage VDD1 and is constant. The third voltage lines L31, L32, and L33 are different voltage lines from the first voltage lines L11, L12, and L13 and the second voltage lines L21, L22, and L23. The third voltage lines L31, L32, and L33 supply the constant third voltage VDD2. The fourth voltage lines L41, L42, and L43 are different voltage lines from the first voltage lines L11, L12, and L13 and the second voltage lines L21, L22, and L23. The fourth voltage lines L41, L42, and L43 supply the fourth voltage GND2 that is lower than the third voltage VDD2 and is constant. The first voltage lines L11, L12, and L13 are electrically connected to the drains of the NMOS transistors N1, N2, and N3, and the third voltage lines L31, L32, and L33 are electrically connected to the gates of the NMOS transistors N1, N2, and N3. The second voltage lines L21, L22, and L23 are electrically connected to the drains of the PMOS transistors P1, P2, and P3, and the fourth voltage lines L41, L42, and L43 are electrically connected to the gates of the PMOS transistors P1, P2, and P3. At least one of the plurality of functional circuit units has the logic circuits (inverter circuits INV1, INV2, and INV3) having the first power supply terminals Tu1, Tu2, and Tu3 and the second power supply terminals Td1, Td2, and Td3. The first power supply terminals Tu1, Tu2, and Tu3 are electrically connected to the sources of the NMOS transistors N1, N2, and N3, and the second power supply terminals Td1, Td2, and Td3 are electrically connected to the sources of the PMOS transistors P1, P2, and P3.

In the first embodiment, the influence of a voltage change (bounce) on the inverter circuits INV1, INV2, and INV3 can be reduced. Thus, a decrease in accuracy of A/D conversion can be suppressed. As a result, deterioration in image quality can be suppressed.

Any of the configuration illustrated in FIG. 2 and the configuration illustrated in FIG. 3 may be adopted for the configuration of the comparison delay unit 33. Thus, freedom of layout is improved.

Second Embodiment

Figure 4:
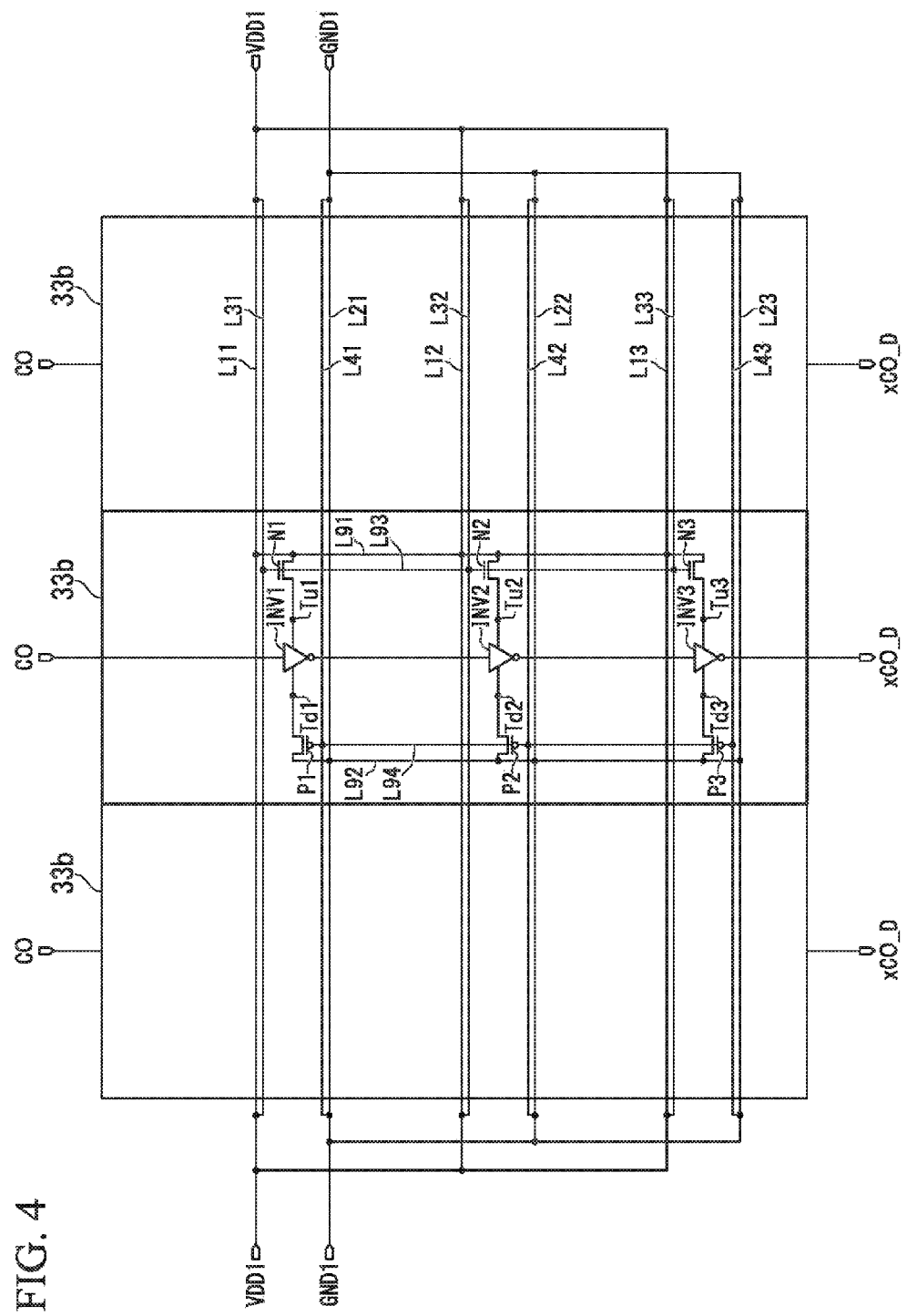
FIG. 4 is a circuit diagram illustrating a configuration of a comparison delay unit according to a second embodiment of the present invention.

FIG. 4 illustrates a configuration of a comparison delay unit 33b that is an example of still another configuration of the comparison delay unit 33 of the imaging device 1 according to a second embodiment of the present invention. In FIG. 4, three comparison delay units 33b corresponding to three columns of the array of the plurality of unit pixels 3 are illustrated. The three comparison delay units 33b are the same. In FIG. 4, only the configuration of the central comparison delay unit 33b among the three comparison delay units 33b is illustrated. The configurations of the other two comparison delay units 33b are omitted for the sake of convenience.

As illustrated in FIG. 4, the comparison delay unit 33b has the inverter circuits INV1, INV2, and INV3, the NMOS transistors N1, N2, and N3, the PMOS transistors P1, P2, and P3, the first voltage lines L11, L12, and L13, the second voltage lines L21, L22, and L23, the third voltage lines L31, L32, and L33, the fourth voltage lines L41, L42, and L43, and the voltage lines L91, L92, L93, and L94.

Differences of the configuration illustrated in FIG. 4 from that illustrated in FIG. 2 will be described. The first voltage lines L11, L12, and L13 and the third voltage lines L31, L32, and L33 are connected to each other outside of the region in which the comparison delay units 33b are disposed. Thus, a first voltage supplied through the first voltage lines L11, L12, and L13 is the same as a third voltage supplied through the third voltage lines L31, L32, and L33. In the present example, the first voltage VDD1 is supplied through the first voltage lines L11, L12, and L13 and the third voltage lines L31, L32, and L33.

The second voltage lines L21, L22, and L23 and the fourth voltage lines L41, L42, and L43 are connected to each other outside of the region in which the comparison delay units 33b are disposed. Thus, a second voltage supplied through the second voltage lines L21, L22, and L23 is the same as a fourth voltage supplied through the fourth voltage lines L41, L42, and L43. In the present example, the second voltage GND1 is supplied through the second voltage lines L21, L22, and L23 and the fourth voltage lines L41, L42, and L43.

Details of the configuration illustrated in FIG. 4 other than those described above are substantially the same as those of the configuration illustrated in FIG. 2.

In the configuration illustrated in FIG. 4, the first voltage lines L11, L12, and L13 and the third voltage lines L31, L32, and L33 are disposed in common for the plurality of comparison delay units 33b as with the configuration illustrated in FIG. 2. In the present example, the first voltage lines L11, L12, and L13 and the third voltage lines L31, L32, and L33 are disposed to traverse the plurality of comparison delay units 33b lined up in the horizontal direction (the lateral direction of FIG. 4). In addition, the first voltage lines L11, L12, and L13 and the third voltage lines L31, L32, and L33 are electrically separated from each other in each of the plurality of comparison delay units 33b.

In the configuration illustrated in FIG. 4, the second voltage lines L21, L22, and L23 and the fourth voltage lines L41, L42, and L43 are disposed in common for the plurality of comparison delay units 33b as with the configuration illustrated in FIG. 2. In the present example, the second voltage lines L21, L22, and L23 and the fourth voltage lines L41, L42, and L43 are disposed to traverse the plurality of the comparison delay units 33b lined up in the horizontal direction (the lateral direction of FIG. 4). In addition, the second voltage lines L21, L22, and L23 and the fourth voltage lines L41, L42, and L43 are electrically separated from each other in each of the plurality of comparison delay units 33b.

Each of the plurality of comparison delay units 33b corresponds to each of the plurality of column A/D conversion units 16. Thus, the first voltage lines L11, L12, and L13 and the third voltage lines L31, L32, and L33 are disposed in common for the plurality of column A/D conversion units 16 (column circuits). In the present example, the first voltage lines L11, L12, and L13 and the third voltage lines L31, L32, and L33 are disposed to traverse the plurality of column A/D conversion units 16 lined up in the horizontal direction (the lateral direction of FIG. 4). In addition, the first voltage lines L11, L12, and L13 and the third voltage lines L31, L32, and L33 are electrically separated from each other in each of the plurality of column A/D conversion units 16.

Likewise, the second voltage lines L21, L22, and L23 and the fourth voltage lines L41, L42, and L43 are disposed in common for the plurality of column A/D conversion units 16. In the present example, the second voltage lines L21, L22, and L23 and the fourth voltage lines L41, L42, and L43 are disposed to traverse the plurality of column A/D conversion units 16 lined up in the horizontal direction (the lateral direction of FIG. 4). In addition, the second voltage lines L21, L22, and L23 and the fourth voltage lines L41, L42, and L43 are electrically separated from each other in each of the plurality of column A/D conversion units 16.

In order to inhibit transmission of a change in drain voltages of the NMOS transistors N1, N2, and N3 to the gates of the NMOS transistors N1, N2, and N3, it is desirable that the third voltage lines L31, L32, and L33 be connected to the first voltage lines L11, L12, and L13 at positions close to a voltage source. Thus, the third voltage lines L31, L32, and L33 are connected to the first voltage lines L11, L12, and L13 outside of the region in which the comparison delay units 33b are disposed.

Likewise, in order to inhibit transmission of a change in drain voltages of the PMOS transistors P1, P2, and P3 to the gates of the PMOS transistor P1, P2, P3, it is desirable that the fourth voltage lines L41, L42, and L43 be connected to the second voltage lines L21, L22, and L23 at positions close to a voltage source. Thus, the fourth voltage lines L41, L42, and L43 are connected to the second voltage lines L21, L22, and L23 outside of the region in which the comparison delay units 33b are disposed.

In the second embodiment, compared with in the first embodiment, the number of power supplies can be reduced.

Third Embodiment

Figure 5:
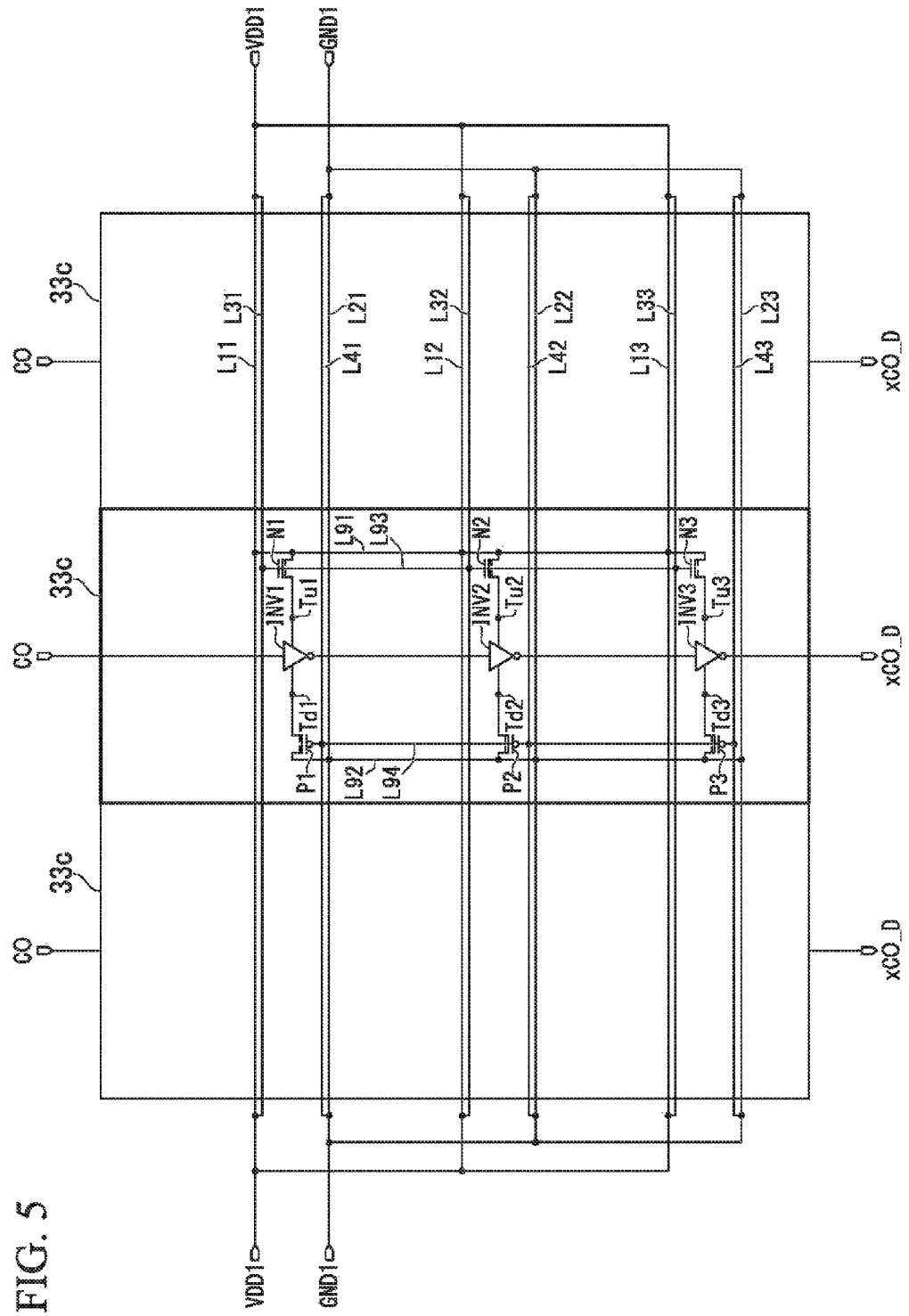
FIG. 5 is a circuit diagram illustrating a configuration of a comparison delay unit according to a third embodiment of the present invention.

FIG. 5 illustrates a configuration of a comparison delay unit 33c that is an example of still another configuration of the comparison delay unit 33 of the imaging device 1 according to a third embodiment of the present invention. In FIG. 5, three comparison delay units 33c corresponding to three columns of the array of the plurality of unit pixels 3 are illustrated. The three comparison delay units 33c are the same. In FIG. 5, only the configuration of the central comparison delay unit 33c among the three comparison delay units 33c is illustrated. The configurations of the other two comparison delay units 33c are omitted for the sake of convenience.

As illustrated in FIG. 5, the comparison delay unit 33c has the inverter circuits INV1, INV2, and INV3, the NMOS transistors N1, N2, and N3, the PMOS transistors P1, P2, and P3, the first voltage lines L11, L12, and L13, the second voltage lines L21, L22, and L23, the third voltage lines L31, L32, and L33, the fourth voltage lines L41, L42, and L43, and the voltage lines L91, L92, L93, and L94.

Differences of the configuration illustrated in FIG. 5 from that illustrated in FIG. 4 will be described. In FIG. 5, the threshold voltage of each of the NMOS transistors N1, N2, and N3 and the PMOS transistors P1, P2, and P3 has been adjusted. As illustrated in FIG. 5, when the first voltage VDD1 is supplied to the gates of the NMOS transistors N1, N2, and N3, and the second voltage GND1 is supplied to the gates of the PMOS transistors P1, P2, and P3, the threshold voltage of each transistor is as follows.

For example, a case in which, in the comparison delay unit 33 illustrated in FIG. 2, the threshold voltage of the NMOS transistors N1, N2, and N3 is 0.7 [V] and the threshold voltage of the PMOS transistors P1, P2, and P3 is −0.7 [V] is considered. In the comparison delay unit 33 illustrated in FIG. 2, for example, the first voltage VDD1 can be 3.3 [V], the second voltage GND1 can be 0 [V], the third voltage VDD2 can be 4 [V], and the fourth voltage GND2 can be −0.7 [V].

A voltage supplied to the gates of the NMOS transistors N1, N2, and N3 illustrated in FIG. 2 is 4 [V], and a voltage supplied to the gates of the NMOS transistors N1, N2, and N3 illustrated in FIG. 5 is 3.3 [V]. In order to make drain currents in FIG. 4 and FIG. 5 the same as each other, the threshold voltage of the NMOS transistors N1, N2, and N3 illustrated in FIG. 5 is 0 [V] based on Formula (1). In addition, a voltage supplied to the gates of the PMOS transistors P1, P2, and P3 illustrated in FIG. 2 is −0.7 [V], and a voltage supplied to the gates of the PMOS transistors P1, P2, and P3 illustrated in FIG. 5 is 0 [V]. In order to make drain currents in FIG. 4 and FIG. 5 the same as each other, the threshold voltage of the PMOS transistors P1, P2, and P3 illustrated in FIG. 5 is 0 [V] based on Formula (2).

Details of the configuration illustrated in FIG. 5 other than those described above are substantially the same as those of the configuration illustrated in FIG. 4.

Since the threshold voltages of the NMOS transistors N1, N2, and N3 and the PMOS transistors P1, P2, and P3 are set to be optimum in the third embodiment, the third voltage VDD2 and the fourth voltage GND2 of the first embodiment are unnecessary. In addition, operation points of the comparison delay unit 33c can be optimized.

Fourth Embodiment

Figure 6:
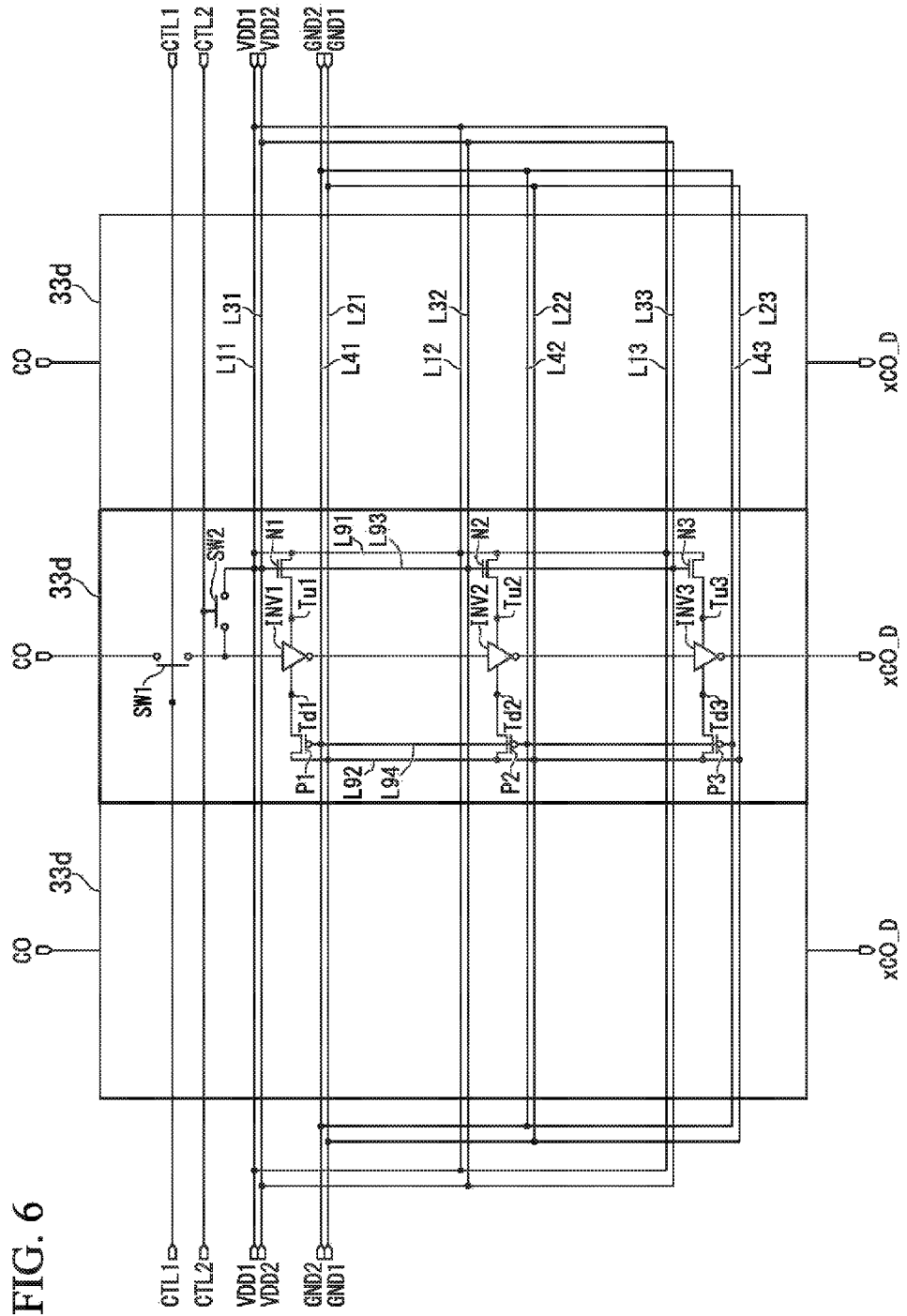
FIG. 6 is a circuit diagram illustrating a configuration of a comparison delay unit according to a fourth embodiment of the present invention.

FIG. 6 illustrates a configuration of a comparison delay unit 33d that is an example of still another configuration of the comparison delay unit 33 of the imaging device 1 according to a fourth embodiment of the present invention. In FIG. 6, three comparison delay units 33d corresponding to three columns of the array of the plurality of unit pixels 3 are illustrated. The three comparison delay units 33d are the same. In FIG. 6, only the configuration of the central comparison delay unit 33d among the three comparison delay units 33d is illustrated. The configurations of the other two comparison delay units 33d are omitted for the sake of convenience.

As illustrated in FIG. 6, the comparison delay unit 33d has the inverter circuits INV1, INV2, and INV3, the NMOS transistors N1, N2, and N3, the PMOS transistors P1, P2, and P3, a first switch element SW1, a second switch element SW2, the first voltage lines L11, L12, and L13, the second voltage lines L21, L22, and L23, the third voltage lines L31, L32, and L33, the fourth voltage lines L41, L42, and L43, and the voltage lines L91, L92, L93, and L94.

Differences of the configuration illustrated in FIG. 6 from that illustrated in FIG. 2 will be described. In FIG. 6, the first switch element SW1 and the second switch element SW2 are disposed. Each of the first switch element SW1 and the second switch element SW2 has a first terminal and a second terminal. The first terminal of the first switch element SW1 is connected to the output terminal of the comparison unit 31. A comparison signal CO from the comparison unit 31 is input to the first terminal of the first switch element SW1. The second terminal of the first switch element SW1 is connected to the input terminal of the inverter circuit INV1. The first terminal of the second switch element SW2 is connected to the first voltage line L11. The first voltage VDD1 is input to the first terminal of the second switch element SW2. The second terminal of the second switch element SW2 is connected to the input terminal of the inverter circuit INV1.

A first control signal CTL1 is supplied from the control unit 20 to the first switch element SW1. The first control signal CTL1 controls switching of the first switch element SW1 on and off. A second control signal CTL2 is supplied from the control unit 20 to the second switch element SW2. The second control signal CTL2 controls switching of the second switch element SW2 on and off.

Details of the configuration illustrated in FIG. 6 other than those described above are substantially the same as those of the configuration illustrated in FIG. 2.

Next, an operation of the comparison delay unit 33d will be described. When a comparison signal CO before A/D conversion is performed is in an L state, the first switch element SW1 is set to be in an OFF state, and the second switch element SW2 is set to be in an ON state. Accordingly, the first voltage VDD1 is input to the input terminal of the inverter circuit INV1. Consequently, the voltage of the input terminal of the inverter circuit INV1 goes into an H state. As the voltage of the input terminal of the inverter circuit INV1 changes from an L state to the H state, voltages of the input terminals of the inverter circuits INV2 and INV3 in the following stages change in order.

Then, the first switch element SW1 is set to be in an ON state and the second switch element SW2 is set to be in an OFF state. Accordingly, the first voltage VDD1 is cut off from the input terminal of the inverter circuit INV1. Since the comparison signal CO is in the L state at this time, the voltage of the input terminal of the inverter circuit INV1 goes into an L state. As the voltage of the input terminal of the inverter circuit INV1 changes from the H state to the L state, the voltages of the input terminals of the inverter circuits INV2 and INV3 in the following stages change in order.

As the comparison delay unit 33d operates as described above, voltages of the respective nodes of the output terminals of the inverter circuits INV1, INV2, and INV3, the sources of the NMOS transistors N1, N2, and N3, and the sources of the PMOS transistors P1, P2, and P3 are refreshed. That is, the voltages of the respective nodes become predetermined voltages. For example, the initialization of the comparison delay unit 33d is performed as described above in a predetermined period before A/D conversion is performed. After the initialization of the comparison delay unit 33d is performed, A/D conversion is performed. A configuration for performing the initialization of the comparison delay unit 33d is not limited to the configuration illustrated in FIG. 6.

A capacitance such as a wiring capacitance is given to the respective nodes. When a voltage of the capacitance at the time of a start of A/D conversion is different at each time of A/D conversion, a time required for charging or discharging the capacitance is different at each time of A/D conversion. Thus, delay times of the comparison delay unit 33d vary at each time of A/D conversion.

In the fourth embodiment, as the initialization of the comparison delay unit 33d is performed, voltages of the respective nodes of the comparison delay unit 33d before A/D conversion can be made substantially the same as each other for all times of A/D conversion. Accordingly, it is hard to cause variation in delay times of the comparison delay unit 33d.

Fifth Embodiment

Figure 7:
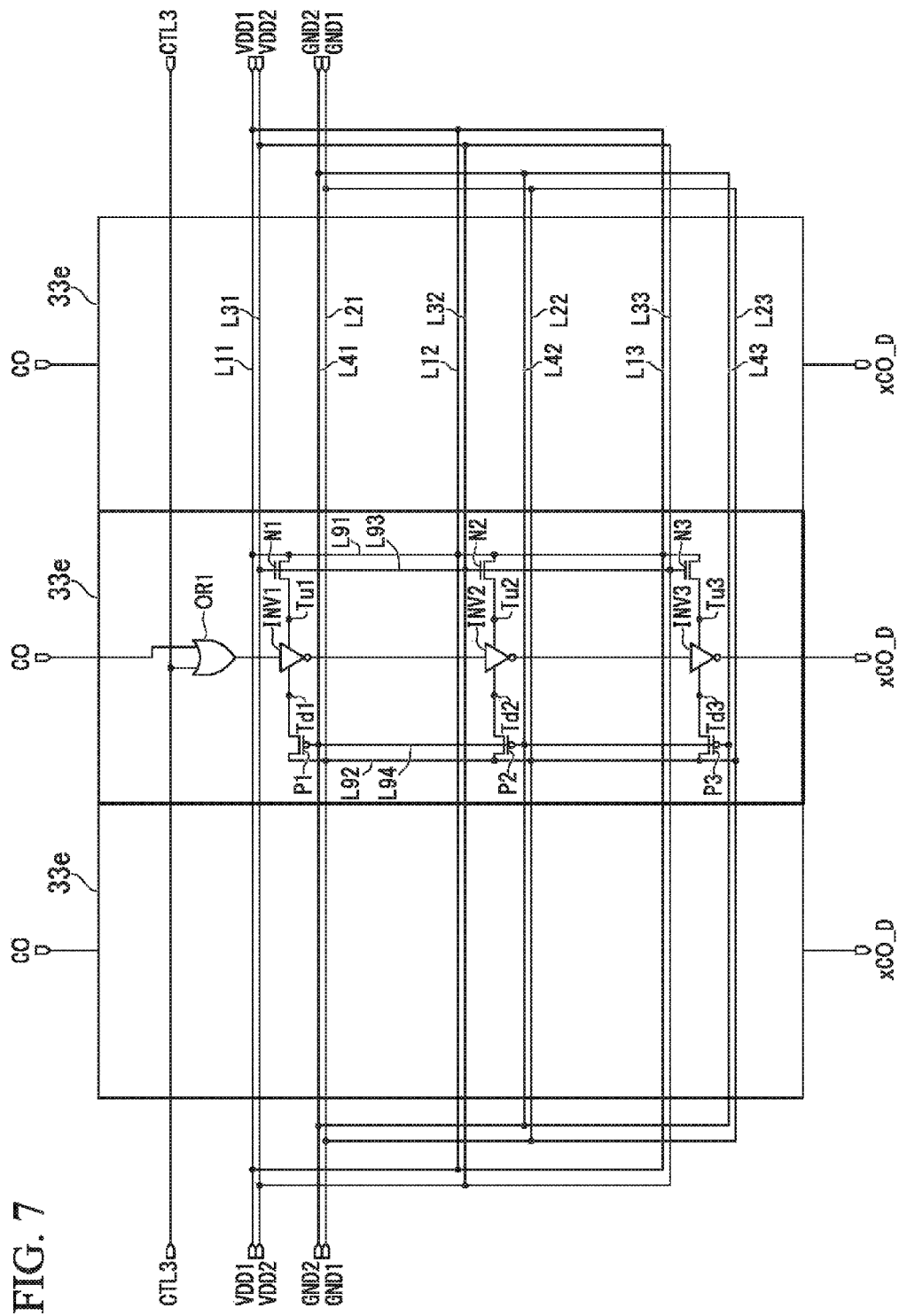
FIG. 7 is a circuit diagram illustrating a configuration of a comparison delay unit according to a fifth embodiment of the present invention.

FIG. 7 illustrates a configuration of a comparison delay unit 33e that is an example of still another configuration of the comparison delay unit 33 of the imaging device 1 according to a fifth embodiment of the present invention. In FIG. 7, three comparison delay units 33e corresponding to three columns of the array of the plurality of unit pixels 3 are illustrated. The three comparison delay units 33e are the same. In FIG. 7, only the configuration of the central comparison delay unit 33e among the three comparison delay units 33e is illustrated. The configurations of the other two comparison delay units 33e are omitted for the sake of convenience.

As illustrated in FIG. 7, the comparison delay unit 33e has the inverter circuits INV1, INV2, and INV3, the NMOS transistors N1, N2, and N3, the PMOS transistors P1, P2, and P3, an OR circuit OR1, the first voltage lines L11, L12, and L13, the second voltage lines L21, L22, and L23, the third voltage lines L31, L32, and L33, the fourth voltage lines L41, L42, and L43, and the voltage lines L91, L92, L93, and L94.

Differences of the configuration illustrated in FIG. 7 from that illustrated in FIG. 2 will be described. In FIG. 7, the OR circuit OR1 is disposed. The OR circuit OR1 has a first input terminal, a second input terminal, and an output terminal. The first input terminal of the OR circuit OR1 is connected to the output terminal of the comparison unit 31. A comparison signal CO from the comparison unit 31 is input to the first input terminal of the OR circuit OR1. A third control signal CTL3 from the control unit 20 is input to the second input terminal of the OR circuit OR1. The third control signal CTL3 is a signal in an H state or an L state. The output terminal of the OR circuit OR1 is connected to the input terminal of the inverter circuit INV1. The OR circuit OR1 outputs a signal having the logical sum (OR) of the comparison signal CO from the comparison unit 31 and the third control signal CTL3.

Details of the configuration illustrated in FIG. 7 other than those described above are substantially the same as those of the configuration illustrated in FIG. 2.

Next, an operation of the comparison delay unit 33e will be described. When the comparison signal CO before A/D conversion is performed is in an L state, the third control signal CTL3 changes from an L state to an H state, and then changes to the L state. Accordingly, the voltage of the input terminal of the inverter circuit INV1 changes from an L state to an H state, and then changes to the L state. As the voltage of the input terminal of the inverter circuit INV1 changes as described above, voltages of the input terminals of the inverter circuits INV2, and INV3 in the following states change in order.

As the comparison delay unit 33e operates as described above, voltages of respective nodes of the output terminals of the inverter circuits INV1, INV2, and INV3, the sources of the NMOS transistors N1, N2, and N3, and the sources of the PMOS transistors P1, P2, and P3 are refreshed. That is, the voltages of the respective nodes become predetermined voltages. For example, the initialization of the comparison delay unit 33e is performed as described above in a predetermined period before A/D conversion is performed. After the initialization of the comparison delay unit 33e is performed, A/D conversion is performed. A configuration for performing the initialization of the comparison delay unit 33e is not limited to the configuration illustrated in FIG. 7.

In the fifth embodiment, as the initialization of the comparison delay unit 33e is performed, voltages of the respective nodes of the comparison delay unit 33e before A/D conversion can be made substantially the same as each other for all times of A/D conversion. Accordingly, it is hard to cause variation in delay times of the comparison delay unit 33e.

Sixth Embodiment

Figure 8:
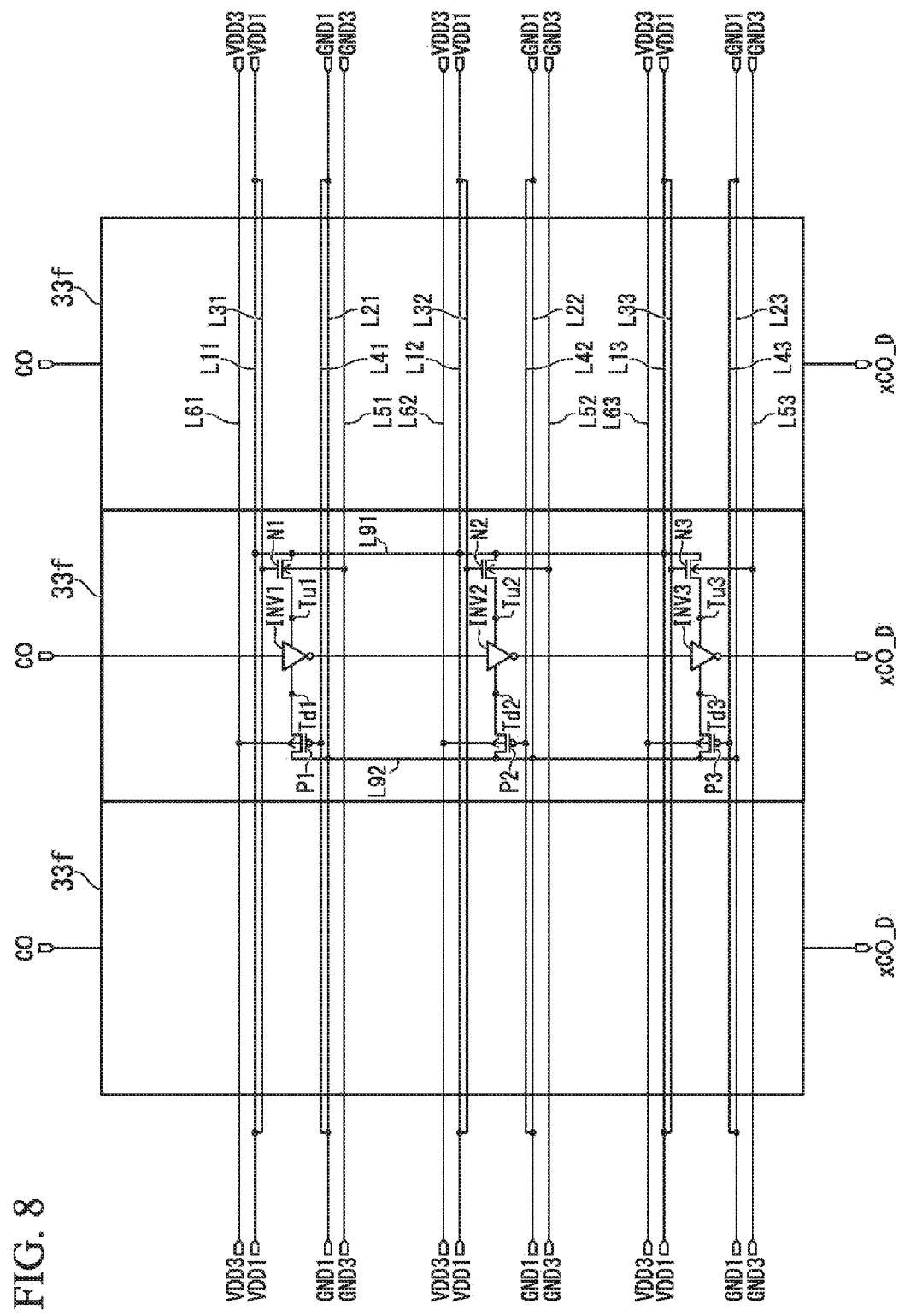
FIG. 8 is a circuit diagram illustrating a configuration of a comparison delay unit according to a sixth embodiment of the present invention.

FIG. 8 illustrates a configuration of a comparison delay unit 33f that is an example of still another configuration of the comparison delay unit 33 of the imaging device 1 according to a sixth embodiment of the present invention. In FIG. 8, three comparison delay units 33f corresponding to three columns of the array of the plurality of unit pixels 3 are illustrated. The three comparison delay units 33f are the same. In FIG. 8, only the configuration of the central comparison delay unit 33f among the three comparison delay units 33f is illustrated. The configurations of the other two comparison delay units 33f are omitted for the sake of convenience.

As illustrated in FIG. 8, the comparison delay unit 33f has the inverter circuits INV1, INV2, and INV3, the NMOS transistors N1, N2, and N3, the PMOS transistors P1, P2, and P3, the first voltage lines L11, L12, and L13, the second voltage lines L21, L22, and L23, the third voltage lines L31, L32, and L33, the fourth voltage lines L41, L42, and L43, fifth voltage lines L51, L52, and L53, sixth voltage lines L61, L62, and L63, and the voltage lines L91, and L92.

Differences of the configuration illustrated in FIG. 8 from that illustrated in FIG. 4 will be described. In FIG. 8, the fifth voltage lines L51, L52, and L53 and the sixth voltage lines L61, L62, and L63 are disposed. The fifth voltage lines L51, L52, and L53 and the sixth voltage lines L61, L62, and L63 are disposed in the horizontal direction (the lateral direction of FIG. 8). The back gates of the NMOS transistors N1, N2, and N3 are electrically connected to the fifth voltage lines L51, L52, and L53. The back gates of the PMOS transistors P1, P2, and P3 are electrically connected to the sixth voltage lines L61, L62, and L63.

The fifth voltage lines L51, L52, and L53 and the sixth voltage lines L61, L62, and L63 are disposed in common for the plurality of the comparison delay units 33f. In the present example, the fifth voltage lines L51, L52, and L53 and the sixth voltage lines L61, L62, and L63 are disposed to traverse the plurality of comparison delay units 33f lined up in the horizontal direction (the lateral direction of FIG. 8). The first voltage lines L11, L12, and L13 and the sixth voltage lines L61, L62, and L63 are electrically separated from each other in each of the plurality of comparison delay units 33f. In addition, the third voltage lines L31, L32, and L33 and the sixth voltage lines L61, L62, and L63 are electrically separated from each other in each of the plurality of comparison delay units 33f. Likewise, the second voltage lines L21, L22, and L23 and the fifth voltage lines L51, L52, and L53 are electrically separated from each other in each of the plurality of comparison delay units 33f. In addition, the fourth voltage lines L41, L42, and L43 and the fifth voltage lines L51, L52, and L53 are electrically separated from each other in each of the plurality of comparison delay units 33f.

A fifth voltage GND3 is applied to the fifth voltage lines L51, L52, and L53 outside of the region in which the comparison delay units 33f are disposed. The fifth voltage GND3 is a different constant voltage from the second voltage GND1. Thus, the fifth voltage lines L51, L52, and L53 supply the constant fifth voltage GND3 that is different from the second voltage GND1 to the back gates of the NMOS transistors N1, N2, and N3 respectively. In addition, the fifth voltage GND3 is a constant voltage higher than the second voltage GND1. A magnitude relationship between the fifth voltage GND3 and the first voltage VDD1 applied to the NMOS transistors N1, N2, and N3 is not particularly limited.

A sixth voltage VDD3 is applied to the sixth voltage lines L61, L62, and L63 outside of the region in which the comparison delay units 33f are disposed. The sixth voltage VDD3 is a different constant voltage from the first voltage VDD1. Thus, the sixth voltage lines L61, L62, and L63 supply the constant sixth voltage VDD3 that is different from the first voltage VDD1 to the back gates of the PMOS transistors P1, P2, and P3 respectively. In addition, the sixth voltage VDD3 is a constant voltage lower than the first voltage VDD1. Moreover, the sixth voltage VDD3 is a constant voltage higher than the fifth voltage GND3. A magnitude relationship between the sixth voltage VDD3 and the second voltage GND1 applied to the gates of the PMOS transistors P1, P2, and P3 is not particularly limited.

In FIG. 8, the first voltage VDD1 is supplied through the third voltage lines L31, L32, and L33, the second voltage GND1 is supplied through the fourth voltage lines L41, L42, and L43. The third voltage VDD2 may be supplied through the third voltage lines L31, L32, and L33 as with the configuration illustrated in FIG. 2. In addition, the fourth voltage GND2 may be supplied through the fourth voltage lines L41, L42, and L43 as with the configuration illustrated in FIG. 2.

In the sixth embodiment, voltages of the back gates of the NMOS transistors N1, N2, and N3 can be controlled by controlling the fifth voltage GND3. Consequently, threshold voltages of the NMOS transistors N1, N2, and N3 can be controlled. In addition, in the sixth embodiment, voltages of the back gates of the PMOS transistors P1, P2, and P3 can be controlled by controlling the sixth voltage VDD3. Consequently, threshold voltages of the PMOS transistors P1, P2, and P3 can be controlled.

In a manufacturing procedure of the configuration illustrated in FIG. 5, adding a procedure of a semiconductor process is necessary for adjusting the threshold voltages of each transistor of the NMOS transistors N1, N2, and N3 and the PMOS transistors P1, P2, and P3. This procedure, however, is unnecessary in the configuration illustrated in FIG. 8. The fifth voltage lines L51, L52, and L53 and the sixth voltage lines L61, L62, and L63 are formed in the same step as the step in which other voltage lines are formed. Thus, an additional process for forming the fifth voltage lines L51, L52, and L53 and the sixth voltage lines L61, L62, and L63 is unnecessary. In addition, separation of wells having narrow pitches for connecting the sources and the back gates of the NMOS transistors N1, N2, and N3 is unnecessary. Furthermore, separation of wells having narrow pitches for connecting the sources and the back gates of the PMOS transistors P1, P2, and P3 is unnecessary.

Seventh Embodiment

Figure 9:
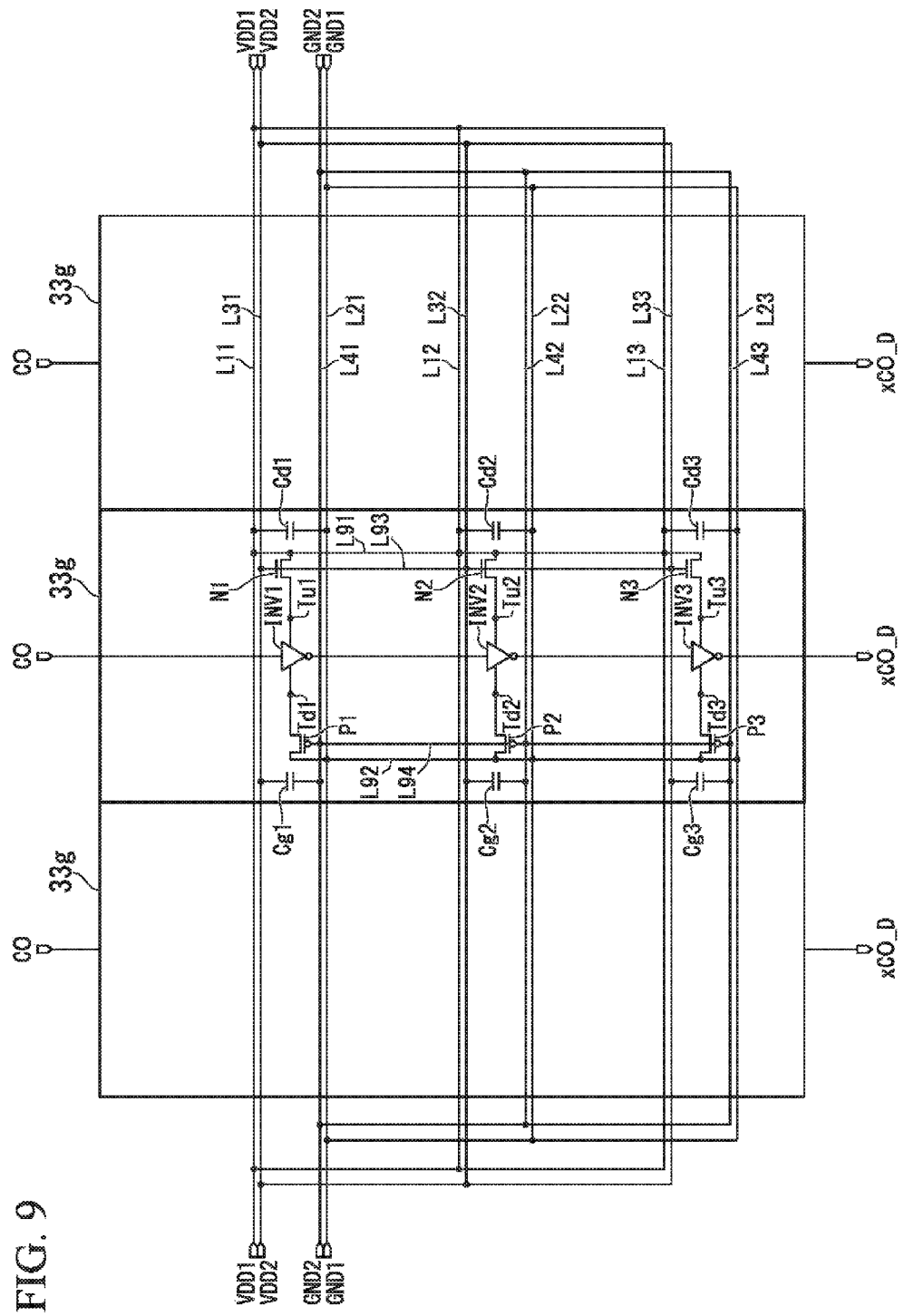
FIG. 9 is a circuit diagram illustrating a configuration of a comparison delay unit according to a seventh embodiment of the present invention.

FIG. 9 illustrates a configuration of a comparison delay unit 33g that is an example of still another configuration of the comparison delay unit 33 of the imaging device 1 according to a seventh embodiment of the present invention. In FIG. 9, three comparison delay units 33g corresponding to three columns of the array of the plurality of unit pixels 3 are illustrated. The three comparison delay units 33g are the same. In FIG. 9, only the configuration of the central comparison delay unit 33g among the three comparison delay units 33g is illustrated. The configurations of the other two comparison delay units 33g are omitted for the sake of convenience.

As illustrated in FIG. 9, the comparison delay unit 33g has the inverter circuits INV1, INV2, and INV3, the NMOS transistors N1, N2, and N3, the PMOS transistors P1, P2, and P3, first capacitors Cd1, Cd2, and Cd3, second capacitors Cg1, Cg2, and Cg3, the first voltage lines L11, L12, and L13, the second voltage lines L21, L22, and L23, the third voltage lines L31, L32, and L33, the fourth voltage lines L41, L42, and L43, and the voltage lines L91, L92, L93, and L94.

Differences of the configuration illustrated in FIG. 9 from that illustrated in FIG. 2 will be described. In FIG. 9, the first capacitors Cd1, Cd2, and Cd3 and the second capacitors Cg1, Cg2, and Cg3 are disposed. The first capacitors Cd1, Cd2, and Cd3 and the second capacitors Cg1, Cg2, and Cg3 each have first terminals and second terminals. The first terminals of the first capacitors Cd1, Cd2, and Cd3 are connected to the first voltage lines L11, L12, and L13. The second terminals of the first capacitors Cd1, Cd2, and Cd3 are connected to the second voltage lines L21, L22, and L23. That is, the first capacitors Cd1, Cd2, and Cd3 are connected between the first voltage lines L11, L12, and L13 and the second voltage lines L21, L22, and L23. The first terminals of the second capacitors Cg1, Cg2, and Cg3 are connected to the third voltage lines L31, L32, and L33. The second terminals of the second capacitors Cg1, Cg2, and Cg3 are connected to the fourth voltage lines L41, L42, and L43. That is, the second capacitors Cg1, Cg2, and Cg3 are connected between the third voltage lines L31, L32, and L33 and the fourth voltage lines L41, L42, and L43.

It is possible in the seventh embodiment to suppress noise superimposed on the respective voltage lines.

Eighth Embodiment

Figure 10:
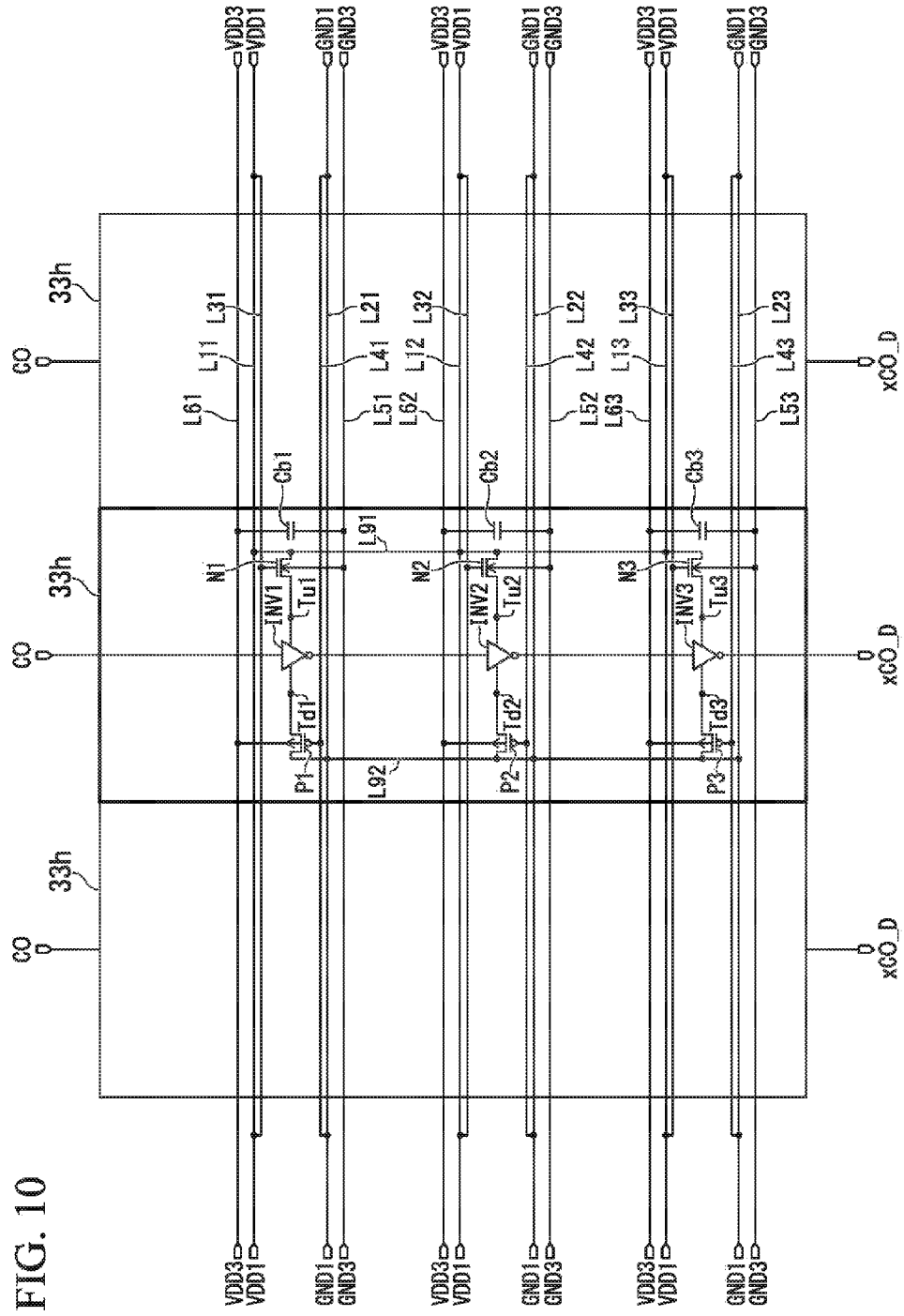
FIG. 10 is a circuit diagram illustrating a configuration of a comparison delay unit according to an eighth embodiment of the present invention.

FIG. 10 illustrates a configuration of a comparison delay unit 33h that is an example of still another configuration of the comparison delay unit 33 of the imaging device 1 according to an eighth embodiment of the present invention. In FIG. 10, three comparison delay units 33h corresponding to three columns of the array of the plurality of unit pixels 3 are illustrated. The three comparison delay units 33h are the same. In FIG. 10, only the configuration of the central comparison delay unit 33h among the three comparison delay units 33h is illustrated. The configurations of the other two comparison delay units 33h are omitted for the sake of convenience.

As illustrated in FIG. 10, the comparison delay unit 33h has the inverter circuits INV1, INV2, and INV3, the NMOS transistors N1, N2, and N3, the PMOS transistors P1, P2, and P3, third capacitors Cb1, Cb2, and Cb3, the first voltage lines L11, L12, and L13, the second voltage lines L21, L22, and L23, the third voltage lines L31, L32, and L33, the fourth voltage lines L41, L42, and L43, and the voltage lines L91, L92, L93, and L94.

Differences of the configuration illustrated in FIG. 10 from that illustrated in FIG. 8 will be described. In FIG. 10, the third capacitors Cb1, Cb2, and Cb3 are disposed. The third capacitors Cb1, Cb2, and Cb3 each have first terminals and second terminals. The first terminals of the third capacitors Cb1, Cb2, and Cb3 are connected to the fifth voltage lines L51, L52, and L53. The second terminals of the third capacitors Cb1, Cb2, and Cb3 are connected to the sixth voltage lines L61, L62, and L63. That is, the third capacitors Cb1, Cb2, and Cb3 are connected between the fifth voltage lines L51, L52, and L53 and the sixth voltage lines L61, L62, and L63.

It is possible in the eighth embodiment to suppress noise superimposed on the fifth voltage lines L51, L52, and L53 and the sixth voltage lines L61, L62, and L63.

Ninth Embodiment

Figure 11:
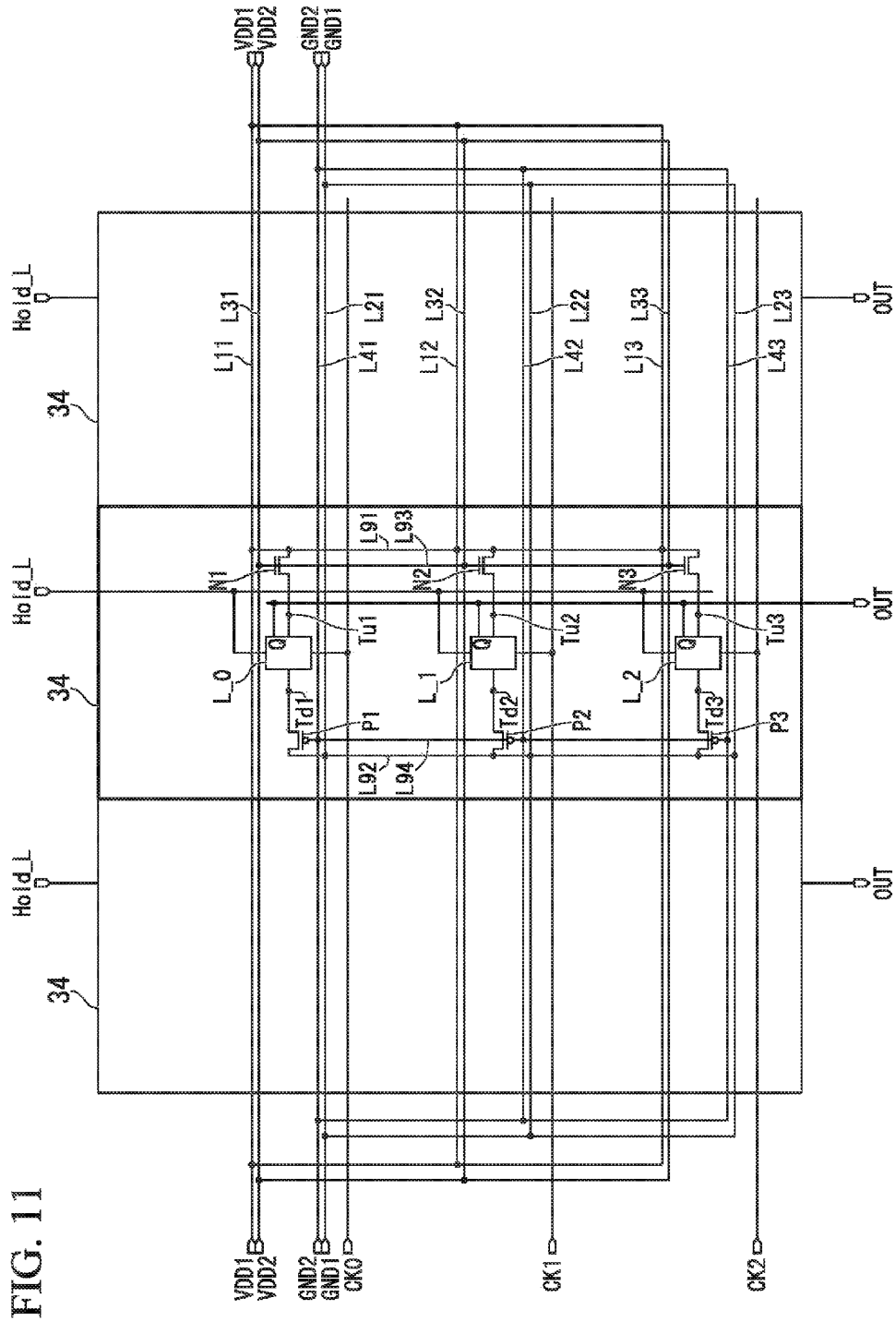
FIG. 11 is a circuit diagram illustrating a configuration of a latch unit according to a ninth embodiment of the present invention.

FIG. 11 illustrates an example of a configuration of a latch unit 34 of the imaging device 1 according to a ninth embodiment of the present invention. In FIG. 11, three latch units 34 corresponding to three columns of the array of the plurality of unit pixels 3 are illustrated. The three latch units 34 are the same. In FIG. 11, only the configuration of the central latch unit 34 among the three latch units 34 is illustrated. The configurations of the other two latch units 34 are omitted for the sake of convenience.

As illustrated in FIG. 11, the latch unit 34 has latch circuits L_0, L_1, and L_2, NMOS transistors N1, N2, and N3, PMOS transistors P1, P2, and P3, first voltage lines L11, L12, and L13, second voltage lines L21, L22, and L23, third voltage lines L31, L32, and L33, fourth voltage lines L41, L42, and L43, and voltage lines L91, L92, L93, and L94.

The latch unit 34 has a plurality of latch circuits L_0, . . . , and L_7 that latch logic states of a plurality of phase signals. The logic state latched by the latch circuits L_0, . . . , and L_7 are signals in H states or L states. With this configuration, the latch unit 34 latches digital signals corresponding to pixel signals. The latch circuits L_0, . . . , and L_7 are logic circuits of the latch unit 34. The latch circuits L_3 to L_7 are omitted for the sake of convenience.

Each of the latch circuits L_0, L_1, . . . , and L_7 has a control signal input terminal, a clock input terminal, and an output terminal. A control signal Hold_L from the latch control unit 32 is input to the control signal input terminals of the latch circuits L_0 to L_6. The control signal Hold_L is, for example, a signal having the logical product (AND) of the comparison signal CO from the comparison unit 31 and a delay comparison signal xCO_D from the comparison delay unit 33. In addition, a control signal having the logical product (AND) of the delay comparison signal xCO_D and a control signal Enable from the control unit 20 is input to the control signal input terminal of the latch circuit L_7 that is not illustrated. Phase signals CK[0] to CK[7] from the VCO 100 of the clock generation unit 18 are input to the clock input terminals of the latch circuits L0 to L7. Signals based on logic states of the phase signals CK[0] to CK[7] latched in the latch circuits L0 to L7 are output from the output terminals of the latch circuits L0 to L7. The signals output from the latch circuits L0 to L7 are output from the latch unit 34 as an output signal OUT.

The latch circuit L_0 has a first power supply terminal Tu1 and a second power supply terminal Td1. The latch circuit L_1 has a first power supply terminal Tu2 and a second power supply terminal Td2. The latch circuit L_2 has a first power supply terminal Tu3 and a second power supply terminal Td3. The connection relationship between the first power supply terminals Tu1, Tu2, and Tu3 and the NMOS transistors N1, N2, and N3 is substantially the same as their connection relationship in the comparison delay unit 33. The connection relationship between the second power supply terminals Td1, Td2, and Td3 and the PMOS transistors P1, P2, and P3 is substantially the same as their connection relationship in the comparison delay unit 33.

Details other than those described above are substantially the same as the corresponding details of the comparison delay unit 33. In addition, configurations of the latch circuits L_3 to L_7 that are not illustrated in FIG. 11 are substantially the same as the configurations of the latch circuits L_0 to L_2.

The details described in the first to the eighth embodiments can be similarly applied to the latch units 34 illustrated in FIG. 11. In the ninth embodiment, a configuration of the comparison delay unit 33 may not employ the configuration illustrated in FIG. 2.

In the ninth embodiment, the influence of a voltage change (bounce) on the latch circuits L0 to L7 can be reduced. Thus, a decrease in accuracy of A/D conversion can be suppressed. As a result, deterioration in image quality can be suppressed.

Tenth Embodiment

Figure 12:
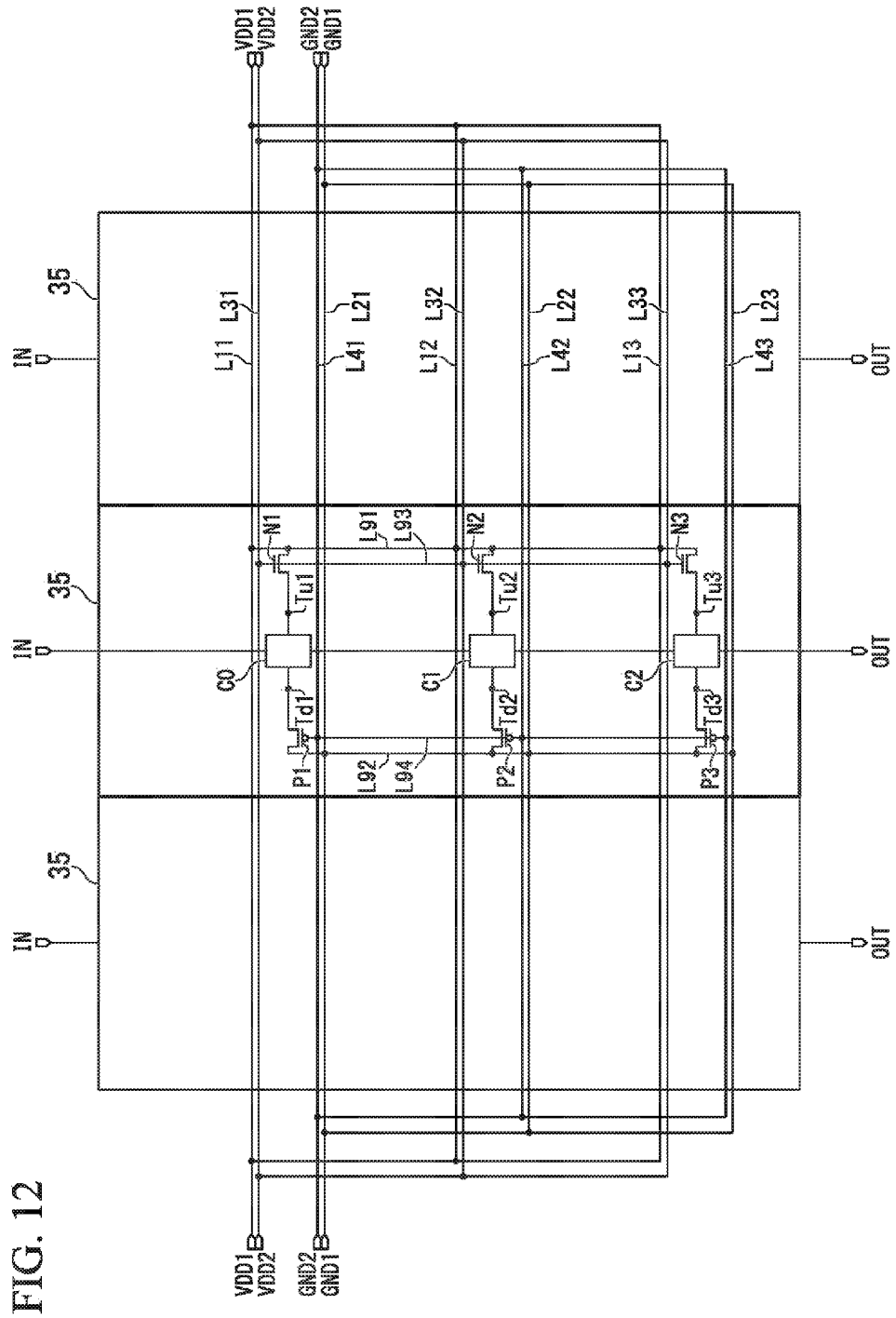
FIG. 12 is a circuit diagram illustrating a configuration of a counter unit according to a tenth embodiment of the present invention.

FIG. 12 illustrates an example of a configuration of a counter unit 35 of the imaging device 1 according to a tenth embodiment of the present invention. In FIG. 12, three counter units 35 corresponding to three columns of the plurality of unit pixels 3 are illustrated. The three counter units 35 are the same. In FIG. 12, only the configuration of the central counter unit 35 among the three counter units 35 is illustrated. The configurations of the other two counter units 35 are omitted for the sake of convenience.

As illustrated in FIG. 12, the counter unit 35 has counter circuit C0, C1, and C2, NMOS transistors N1, N2, and N3, the PMOS transistors P1, P2, and P3, first voltage lines L11, L12, and L13, second voltage lines L21, L22, and L23, third voltage lines L31, L32, and L33, fourth voltage lines L41, L42, and L43, and voltage lines L91, L92, L93, and L94.

The counter unit 35 has the plurality of counter circuits C0, C1, and C2 that perform counting according to the number of delay circuits through which pulse signals have passed for a predetermined period of time. The predetermined period of time refers to a time from a first timing at which the comparison unit 31 starts comparing to a third timing at which the latch unit 34 performs latching. The pulse signals are signals that pass through a plurality of delay units constituting the clock generation unit 18. The delay circuits are the delay units inside the clock generation unit 18. The counter circuits C0, C1, and C2 are logic circuits of the counter unit 35. A count value of the counter circuit C0 corresponds to the least significant bit (LSB) of high-order data constituting digital data. A count value of the counter circuit C2 corresponds to the most significant bit (MSB) of the high-order data constituting the digital data.

Each of the counter circuits C0, C1, and C2 has an input terminal and an output terminal. The phase signal CK[7] output from the latch circuit L_7 of the latch unit 34 is input to the input terminal of the counter circuit C0 as an input signal IN. A signal output from the output terminal of the counter circuit C0 is input to the input terminal of the counter circuit C1. A signal output from the output terminal of the counter circuit C1 is input to the input terminal of the counter circuit C2. A signal output from the output terminal of the counter circuit C2 is output from the counter unit 35 as an output signal OUT. The three counter circuits are illustrated in FIG. 12. The counter unit 35 may have one or two counter circuits, or have four or more counter circuits.

The counter circuit C0 has a first power supply terminal Tu1 and a second power supply terminal Td1. The counter circuit C1 has a first power supply terminal Tu2 and a second power supply terminal Td2. The counter circuit C2 has a first power supply terminal Tu3 and a second power supply terminal Td3. The connection relationship between the first power supply terminals Tu1, Tu2, and Tu3 and the NMOS transistors N1, N2, and N3 is substantially the same as their connection relationship in the comparison delay unit 33. The connection relationship between the second power supply terminals Td1, Td2, and Td3 and the PMOS transistors P1, P2, and P3 is substantially the same as their connection relationship in the comparison delay unit 33.

Details other than those described above are substantially the same as the corresponding details of the comparison delay unit 33.

The details described in the first to the eighth embodiments can be similarly applied to the counter units 35 illustrated in FIG. 12.

In the tenth embodiment, the influence of a voltage change (bounce) on the counter circuits C0, C1, and C2 can be reduced. Thus, a decrease in accuracy of A/D conversion can be suppressed. As a result, deterioration in image quality can be suppressed.

Eleventh Embodiment

Figure 13:
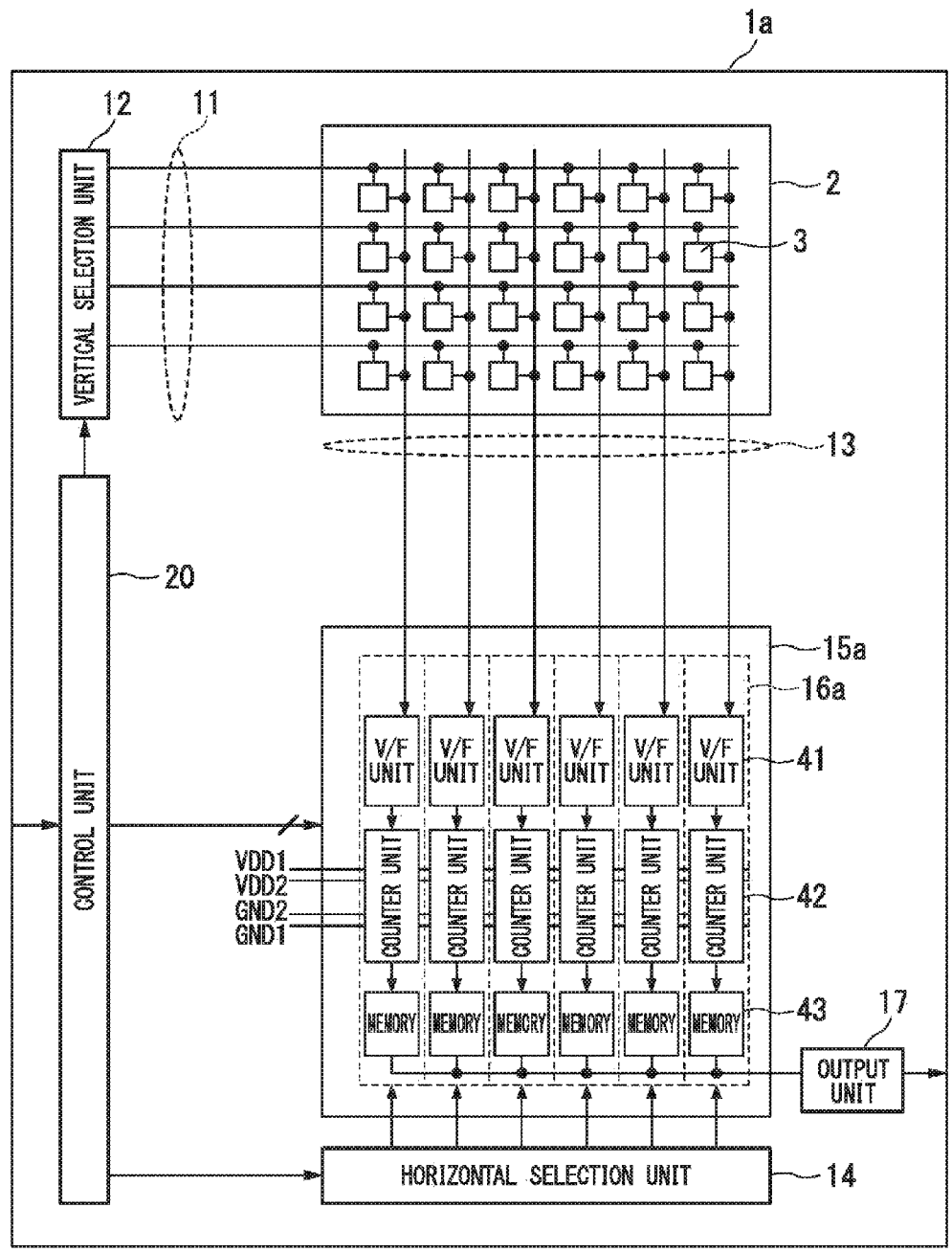
FIG. 13 is a block diagram illustrating a configuration of an imaging device according to an eleventh embodiment of the present invention.

FIG. 13 illustrates an example of an imaging device 1a according to an eleventh embodiment of the present invention. As illustrated in FIG. 13, the imaging device 1a has an imaging unit 2, a vertical selection unit 12, a horizontal selection unit 14, a column processing unit 15a, an output unit 17, and a control unit 20.

Differences of the configuration illustrated in FIG. 13 from that illustrated in FIG. 1 will be described. In FIG. 13, the column processing unit 15 of FIG. 1 is replaced by the column processing unit 15a. The column processing unit 15a has a plurality of column A/D conversion units 16a (column circuits). In FIG. 13, the column A/D conversion units 16 of FIG. 1 are replaced by the column A/D conversion units 16a.

Details of a configuration of the column A/D conversion units 16a will be described. Each of the column A/D conversion units 16a is disposed for a column of the array of a plurality of unit pixels 3. Six column A/D conversion units 16a are disposed in FIG. 13. The column A/D conversion units 16a of the columns are the same. Each of the column A/D conversion units 16a has a plurality of functional circuit units. The functional circuit units of each column A/D conversion unit 16a are a V/F unit 41, a counter unit 42, and a memory 43.

The V/F unit 41 converts voltages of analog pixel signals output from the unit pixels 3 of the imaging unit 2 via vertical signal lines 13 into frequencies. By using a voltage of pixel signals as a control voltage of a voltage control oscillator (VCO), for example, a signal having a frequency according to the voltage of the pixel signal can be obtained. The counter unit 42 measures widths of pulses output from the control unit 20 using the signal output from the V/F unit 41 as a counting clock. A first voltage VDD1, a second voltage GND1, a third voltage VDD2, and a fourth voltage GND2 are supplied to the counter unit 42. The counter unit 42 is, for example, configured similarly to the counter unit 35 illustrated in FIG. 12. The memory 43 holds count values of the counter unit 42.

Details other than those described above are substantially the same as those of the imaging device 1 illustrated in FIG. 1.

In the eleventh embodiment, the influence of a voltage change (bounce) on counter circuits of the counter unit 42 can be reduced. Thus, a decrease in accuracy of A/D conversion can be suppressed. As a result, deterioration in image quality can be suppressed.

Twelfth Embodiment

Figure 14:
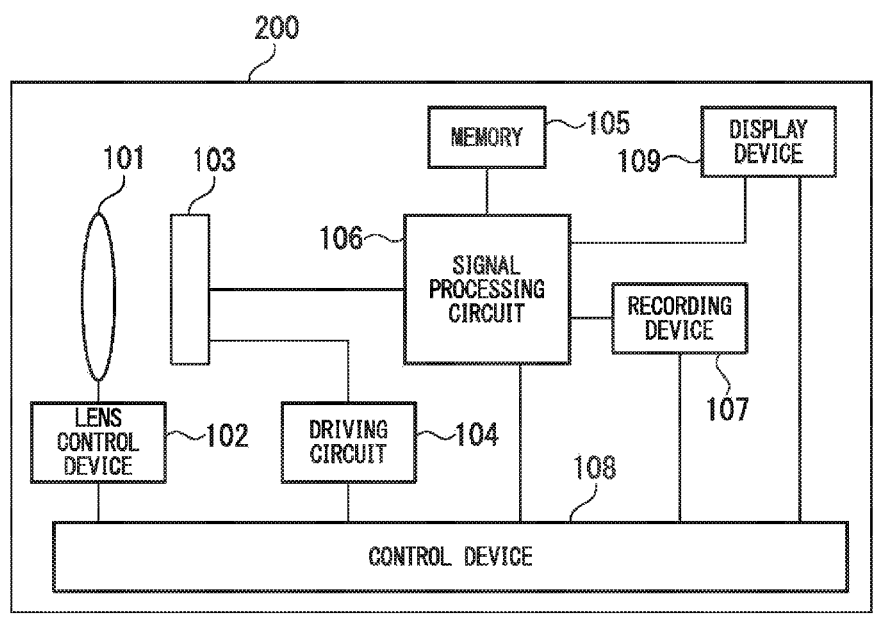
FIG. 14 is a block diagram illustrating a configuration of a digital camera according to a twelfth embodiment of the present invention.
Figure 15:
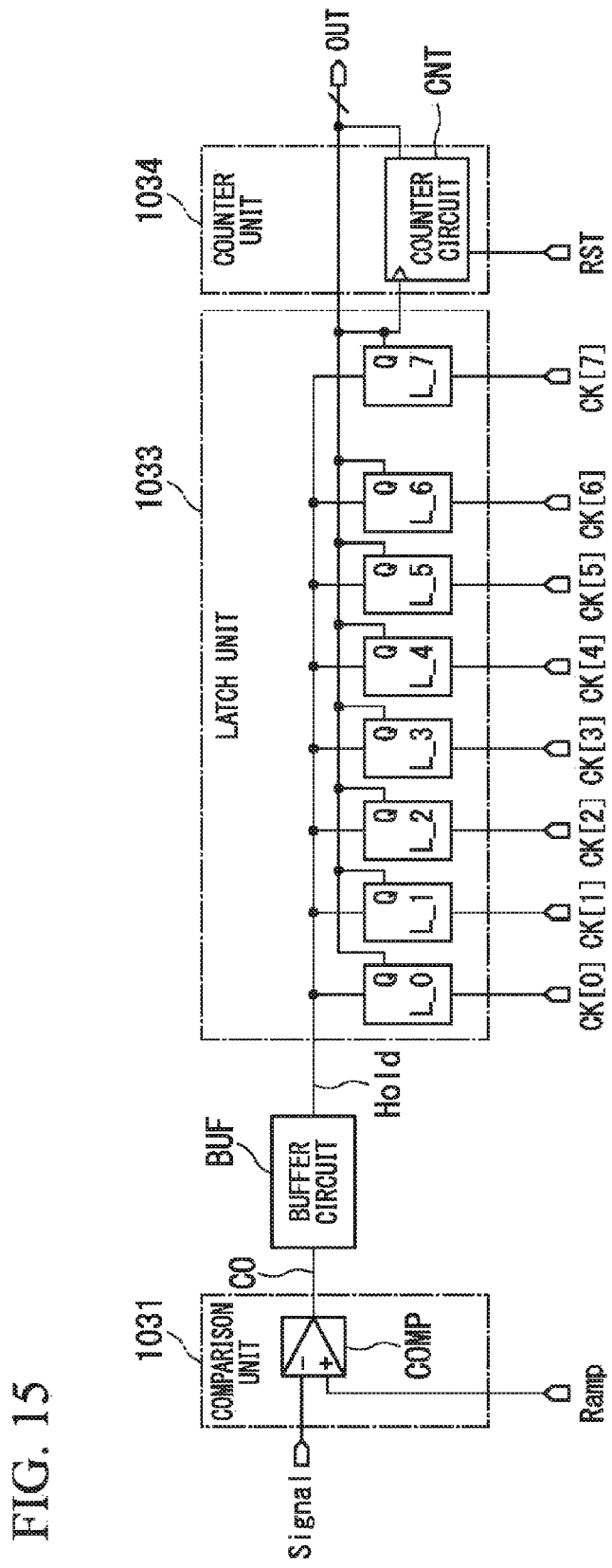
FIG. 15 is a block diagram illustrating a part of a configuration of a TDC SS-type A/D conversion circuit according to a first conventional example.
Figure 16:
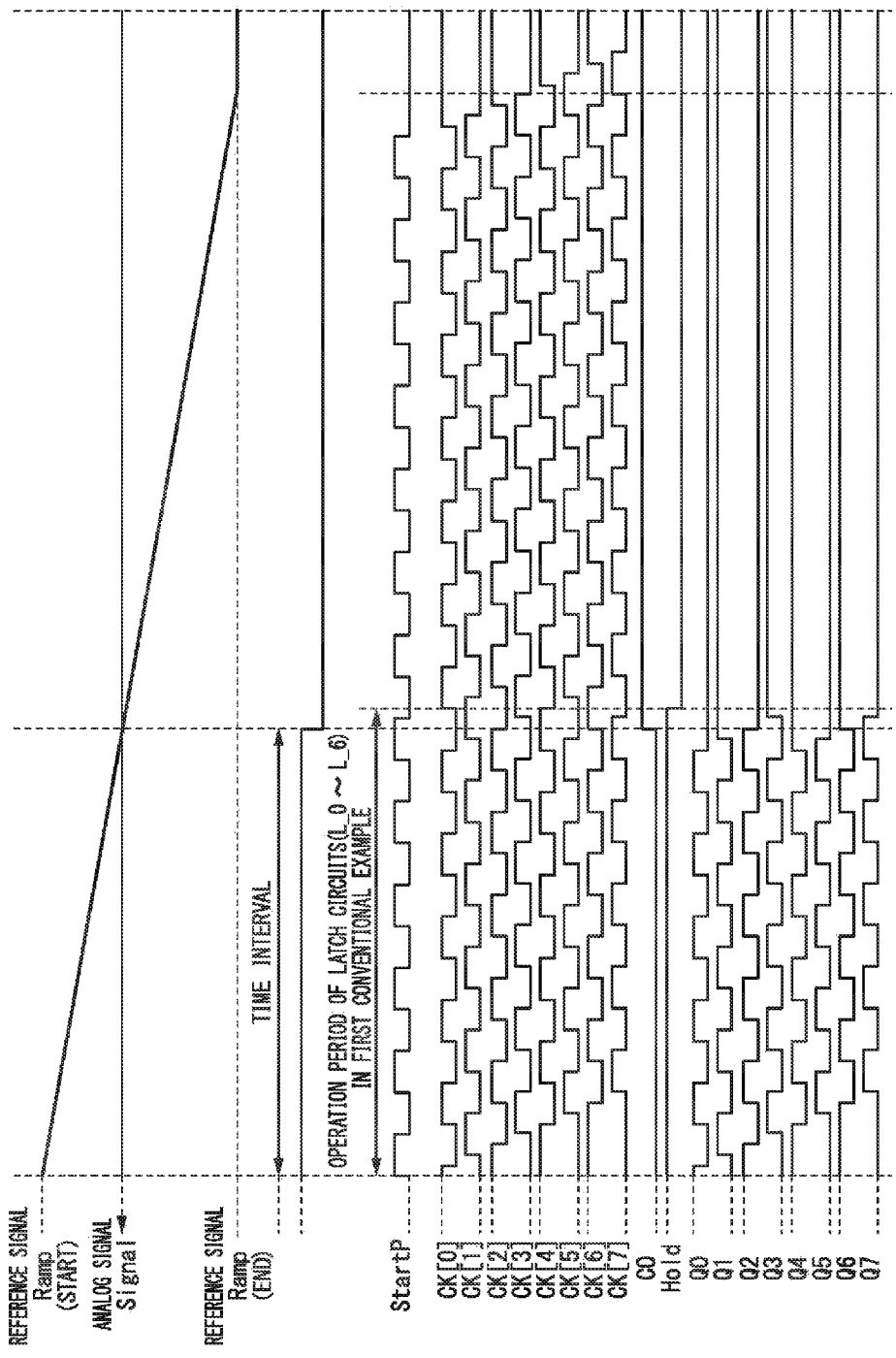
FIG. 16 is a timing chart illustrating an operation of the TDC SS-type A/D conversion circuit according to the first conventional example.
Figure 17:
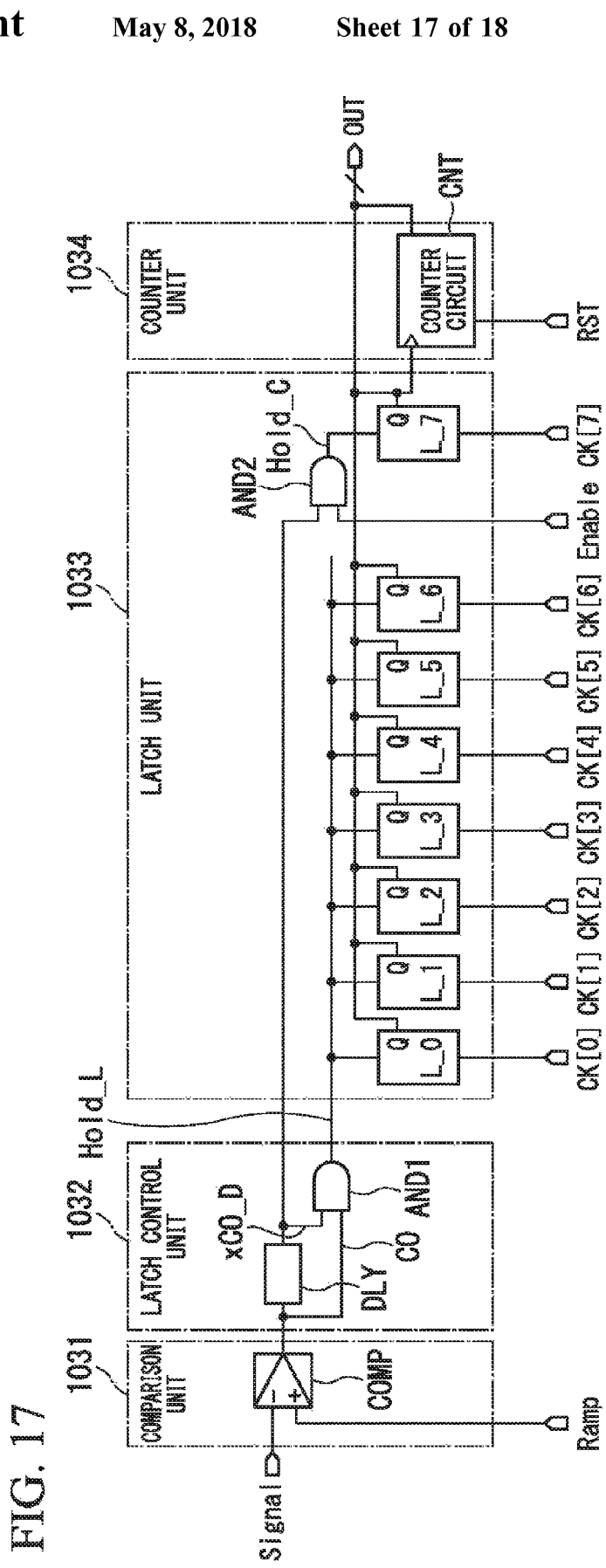
FIG. 17 is a block diagram illustrating a part of a configuration of a TDC SS-type A/D conversion circuit according to a second conventional example.
Figure 18:
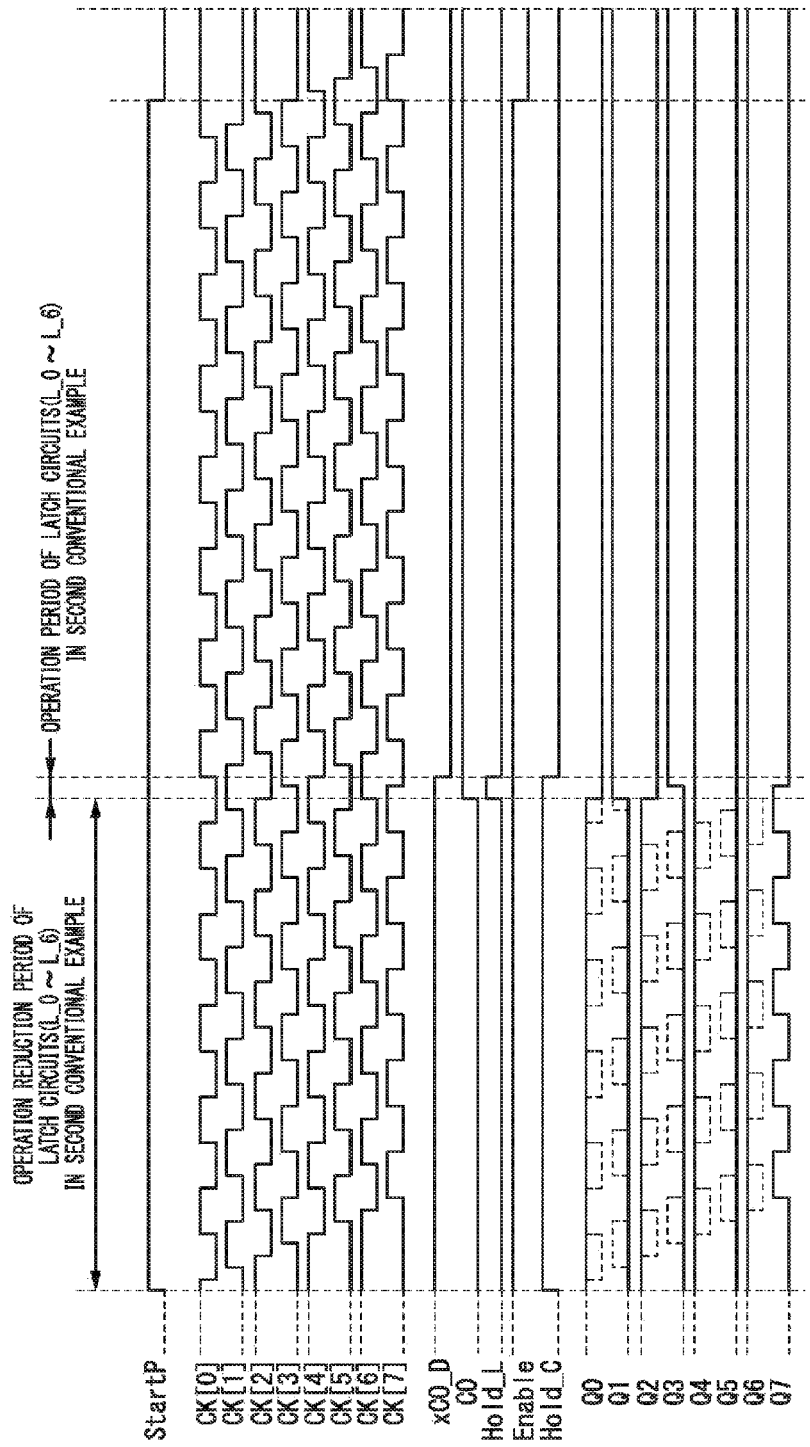
FIG. 18 is a timing chart illustrating an operation of the TDC SS-type A/D conversion circuit according to the second conventional example.

FIG. 14 illustrates a configuration of a digital camera 200 that is an example of an imaging system to which one of the imaging devices 1 of the first to tenth embodiments or the imaging device 1a of the eleventh embodiment is applied.

The imaging system may be an electronic apparatus having an imaging function, or, a digital video camera, an endoscope, or the like, other than a digital camera. The digital camera illustrated in FIG. 14 has a lens unit 101, a lens control device 102, an imaging device 103, a driving circuit 104, a memory 105, a signal processing circuit 106, a recording device 107, a control device 108, and a display device 109.

The lens unit 101 has a zoom lens and a focus lens. The lens unit 101 forms an image of a subject based on light from the subject on a light receiving plane of the imaging device 103. The lens control device 102 controls zooming, focusing, an aperture, and the like of the lens unit 101. Light taken in via the lens unit 101 forms an image on the light receiving plane of the imaging device 103. The imaging device 103 converts the image of the subject formed on the light receiving plane into digital data, i.e., image data and outputs it. The light receiving plane of the imaging device 103 has a plurality of pixels arranged two-dimensionally in a row direction and a column direction. The imaging device 103 is one of the imaging devices 1 of the first to tenth embodiments or the imaging device 1a of the eleventh embodiment.

The driving circuit 104 drives the imaging device 103, and controls operations thereof. The memory 105 temporarily stores image data. The signal processing circuit 106 performs pre-decided processes on the image data output from the imaging device 103. The processes performed by the signal processing circuit 106 include various kinds of correction of the image data, compression of the image data, and the like.

The recording device 107 has a semiconductor memory and the like for performing recording or reading of the image data. The recording device 107 is attachable to and detachable from the digital camera 200. The display device 109 performs display of dynamic images (pre-view images), display of still images, display of states of the digital camera 200, and the like.

The control device 108 controls the digital camera 200 overall. Operations of the control device 108 are stipulated in a program stored in a ROM included in the digital camera 200. The control device 108 reads the program and performs various kinds of control according to the details stipulated in the program.

According to the twelfth embodiment, the imaging system (the digital camera 200) characterized by having one of the imaging devices 1 of the first to tenth embodiments or the imaging device 1a of the eleventh embodiment is configured.

In the twelfth embodiment, a decrease in accuracy of A/D conversion can be suppressed as with the first to the eleventh embodiments. As a result, deterioration in image quality can be suppressed.

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An imaging device, comprising:
   an imaging unit configured to have a plurality of pixels disposed in a matrix shape and whose plurality of pixels have photoelectric conversion elements; and
   column circuits each configured to be disposed for one column or a plurality of columns of an array of the plurality of pixels and to output a digital signal corresponding to a pixel signal output from the pixels of the corresponding column,
   wherein each of the column circuits has
      a plurality of functional circuit units;
      a first voltage line configured to supply a constant first voltage;
      a second voltage line configured to supply a second voltage that is lower than the first voltage and is constant;
      a third voltage line configured to be a different voltage line from the first voltage line and the second voltage line and to supply a constant third voltage;
      a fourth voltage line configured to be a different voltage line from the first voltage line and the second voltage line and to supply a fourth voltage that is lower than the third voltage and is constant;
      an NMOS transistor whose drain is electrically connected to the first voltage line, and whose gate is electrically connected to the third voltage line; and
      a PMOS transistor whose drain is electrically connected to the second voltage line, and whose gate is electrically connected to the fourth voltage line;
   wherein at least one of the plurality of functional circuit units has a logic circuit having a first power supply terminal and a second power supply terminal, and
   wherein the first power supply terminal is electrically connected to a source of the NMOS transistor, and the second power supply terminal is electrically connected to a source of the PMOS transistor.

2. The imaging device according to claim 1, further comprising:
   a clock generation unit configured to output a plurality of phase signals; and
   a reference signal generation unit configured to generate a reference signal that increases or decreases with the elapse of time,
   wherein the plurality of functional circuit units include
      a first functional circuit unit configured to compare the pixel signal and the reference signal, and to output a comparison signal at a timing at which the reference signal satisfies a predetermined condition for the pixel signal;
      a second functional circuit unit configured to be disposed so as to correspond to the first functional circuit unit and to latch logic states of the plurality of phase signals;
      a third functional circuit unit configured to be disposed so as to correspond to the first functional circuit unit and to generate a delay comparison signal by delaying the comparison signal by a predetermined period of time; and
      a fourth functional circuit unit configured to cause the second functional circuit unit to be available at a timing based on the comparison signal, and to cause the second functional circuit unit to execute latching at a timing based on the delay comparison signal,
   wherein the third functional circuit unit has a plurality of logic circuits that delay and output input signals.

3. The imaging device according to claim 1,
wherein the NMOS transistor and the PMOS transistor are disposed so as to correspond to each of the plurality of logic circuits, or disposed so as to correspond to two or more logic circuits among the plurality of logic circuits.

4. The imaging device according to claim 2,
wherein the first voltage and the third voltage are the same,
wherein the first voltage line and the third voltage line are disposed in common for the plurality of third functional circuit units and electrically separated from each other in each of the plurality of third functional circuit units,
wherein the second voltage and the fourth voltage are the same, and
wherein the second voltage line and the fourth voltage line are disposed in common for the plurality of third functional circuit units and electrically separated from each other in each of the plurality of third functional circuit units.

5. The imaging device according to claim 1,
wherein the first voltage and the third voltage are the same,
wherein the first voltage line and the third voltage line are disposed in common for the plurality of column circuits and electrically separated from each other in the plurality of column circuits,
wherein the second voltage and the fourth voltage are the same, and
wherein the second voltage line and the fourth voltage line are disposed in common for the plurality of column circuits and electrically separated from each other in each of the plurality of column circuits.

6. The imaging device according to claim 1,
wherein a back gate of the NMOS transistor is electrically connected to a fifth voltage line that supplies a constant fifth voltage that is different from the second voltage, and
wherein a back gate of the PMOS transistor is electrically connected to a sixth voltage line that supplies a constant sixth voltage that is different from the first voltage.

7. The imaging device according to claim 1,
wherein the functional circuit unit having the logic circuits latches the digital signal.

8. The imaging device according to claim 1,
wherein the functional circuit unit having the logic circuits performs counting according to the number of delay circuits through which a pulse signal has passed for a predetermined period of time.

9. An imaging system having the imaging device according to claim 1.

* * * * *